United States Patent
Murata et al.

(10) Patent No.: US 10,608,049 B2
(45) Date of Patent: Mar. 31, 2020

(54) PHOTOELECTRIC CONVERSION ELEMENT, IMAGE PICKUP ELEMENT, LAMINATED IMAGE PICKUP ELEMENT, AND SOLID-STATE IMAGE PICKUP DEVICE USING AN ORGANIC MATERIAL HAVING DESIRED OPTICAL ABSORPTION PROPERTIES

(71) Applicant: SONY CORPORATION, Tokyo (JP)

(72) Inventors: Masaki Murata, Tokyo (JP); Hideaki Mogi, Kanagawa (JP); Shintarou Hirata, Tokyo (JP); Iwao Yagi, Kanagawa (JP); Yasuharu Ujiie, Kanagawa (JP); Masashi Bando, Kanagawa (JP); Raku Shirasawa, Kanagawa (JP); Hajime Kobayashi, Kanagawa (JP); Mitsunori Nakamoto, Kanagawa (JP); Yuichi Tokita, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 15/743,228

(22) PCT Filed: Jul. 14, 2016

(86) PCT No.: PCT/JP2016/070832
§ 371 (c)(1),
(2) Date: Jan. 9, 2018

(87) PCT Pub. No.: WO2017/014146
PCT Pub. Date: Jan. 26, 2017

(65) Prior Publication Data
US 2018/0219045 A1    Aug. 2, 2018

(30) Foreign Application Priority Data
Jul. 17, 2015   (JP) .................. 2015-142728

(51) Int. Cl.
*H01L 27/30* (2006.01)
*H01L 27/146* (2006.01)
(Continued)

(52) U.S. Cl.
CPC .......... *H01L 27/307* (2013.01); *H01L 27/146* (2013.01); *H01L 27/14667* (2013.01);
(Continued)

(58) Field of Classification Search
CPC ....... H01L 51/42; H01L 27/146; H01L 31/10; H01L 27/307; H01L 51/0074;
(Continued)

(56) References Cited

U.S. PATENT DOCUMENTS

2006/0229670 A1* 10/2006 Bates ................. A61B 17/0057
                                                                    606/213

FOREIGN PATENT DOCUMENTS

| JP | 2006-033942 | 2/2006 |
| JP | 2007-088033 | 4/2007 |

(Continued)

OTHER PUBLICATIONS

Shirota et al., "Charge Carrier Transporting Molecular Materials and Their Applications in Devices", Chemical Reviews_vol. 107, No. 4 953-1010, 2007, 58 pages.
(Continued)

*Primary Examiner* — Thanh T Nguyen
(74) *Attorney, Agent, or Firm* — Sheridan Ross P.C.

(57) ABSTRACT

An image pickup element is constituted by laminating at least a first electrode, an organic photoelectric conversion layer, and a second electrode in order, and the organic photoelectric conversion layer includes a first organic semiconductor material having the following structural formula (1).

(Continued)

US 10,608,049 B2

Page 2

27/14647; H01L 27/286; H01L 27/30;
H01L 51/44; H01L 51/00; Y02E 10/549;
H04N 9/045
See application file for complete search history.

(56) References Cited

FOREIGN PATENT DOCUMENTS

| JP | 2007-123707 | 5/2007 |
| JP | 2007-311647 | 11/2007 |
| JP | 2008-010541 | 1/2008 |
| JP | 2010-232413 | 10/2010 |
| JP | 2010232413 A * | 10/2010 |
| JP | 2015-233117 | 12/2015 |
| WO | WO 2015/163349 | 10/2015 |

OTHER PUBLICATIONS

International Search Report prepared by the Japan Patent Office dated Sep. 27, 2016, for International Application No. PCT/JP2016/070832.

Mori et al., "Efficient Photocurrent Generation at Dinaphtho[2,3-b:2′,3′-f]thieno[3,2-b]thiophene/C60 Bilayer Interface," Applied Physics Express, vol. 4, No. 6, Jun. 2011, 3 pages.

Extended European Search Report for European Patent Application No. 16827706.9, dated Feb. 20, 2019, 7 pages.

\* cited by examiner

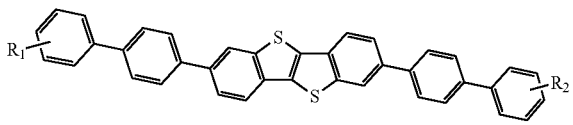

(1)

21 Claims, 14 Drawing Sheets

(51) Int. Cl.
*H01L 51/00* (2006.01)
*H01L 51/44* (2006.01)
*H01L 51/42* (2006.01)
*H01L 27/28* (2006.01)
*H04N 9/04* (2006.01)

(52) U.S. Cl.
CPC ........ *H01L 51/0074* (2013.01); *H01L 51/442* (2013.01); *H01L 27/14647* (2013.01); *H01L 27/286* (2013.01); *H01L 51/424* (2013.01); *H01L 51/4253* (2013.01); *H04N 9/045* (2013.01); *Y02E 10/549* (2013.01)

(58) Field of Classification Search
CPC ............... H01L 51/4253; H01L 51/442; H01L MOLECULE OF p-TYPE SEMICONDUCTOR MATERIAL MOLECULE OF n-TYPE SEMICONDUCTOR MATERIAL F6SubPc-OC6F5

DPh-BTBT

FIG.8
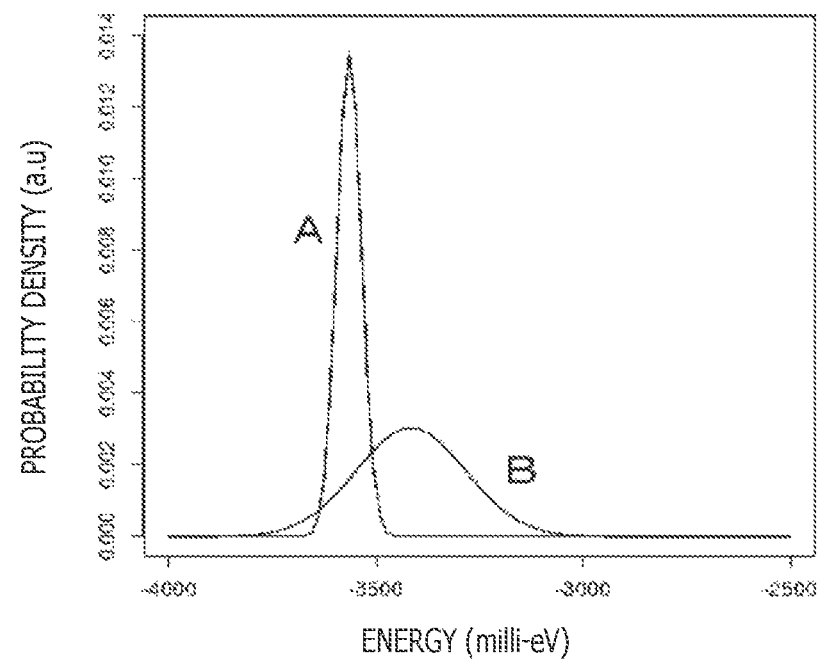
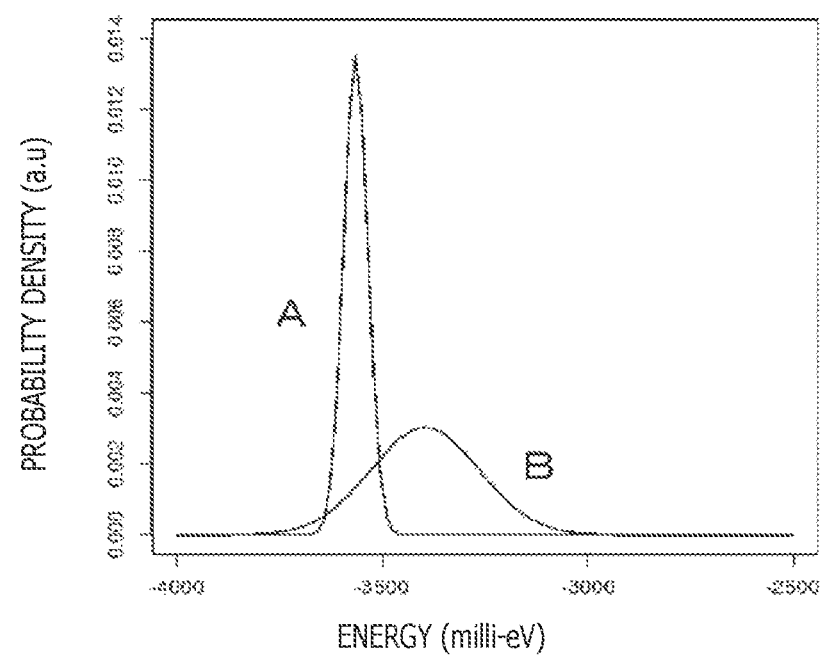

FIG.9
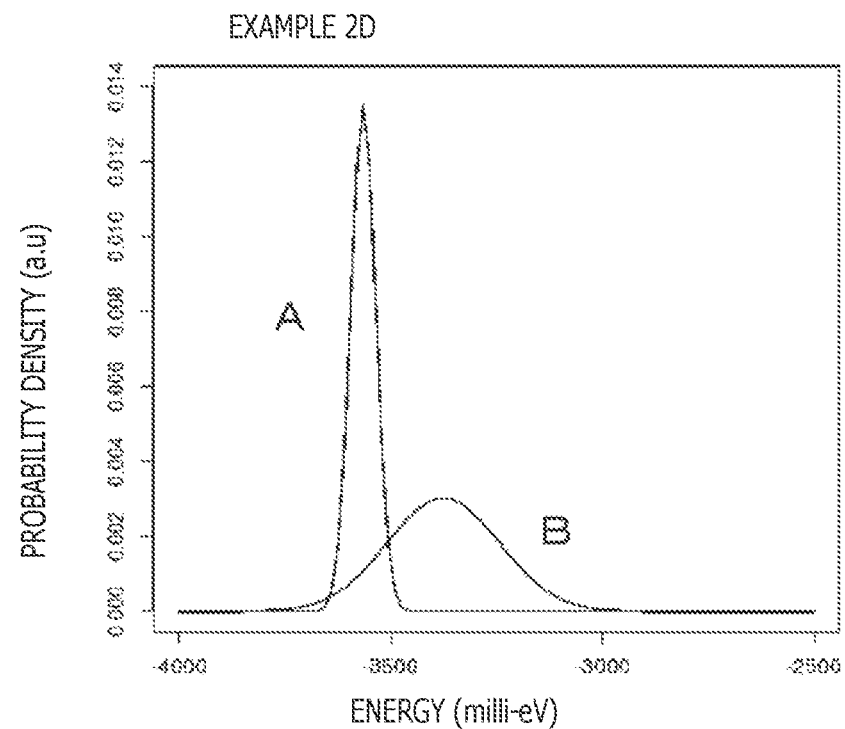
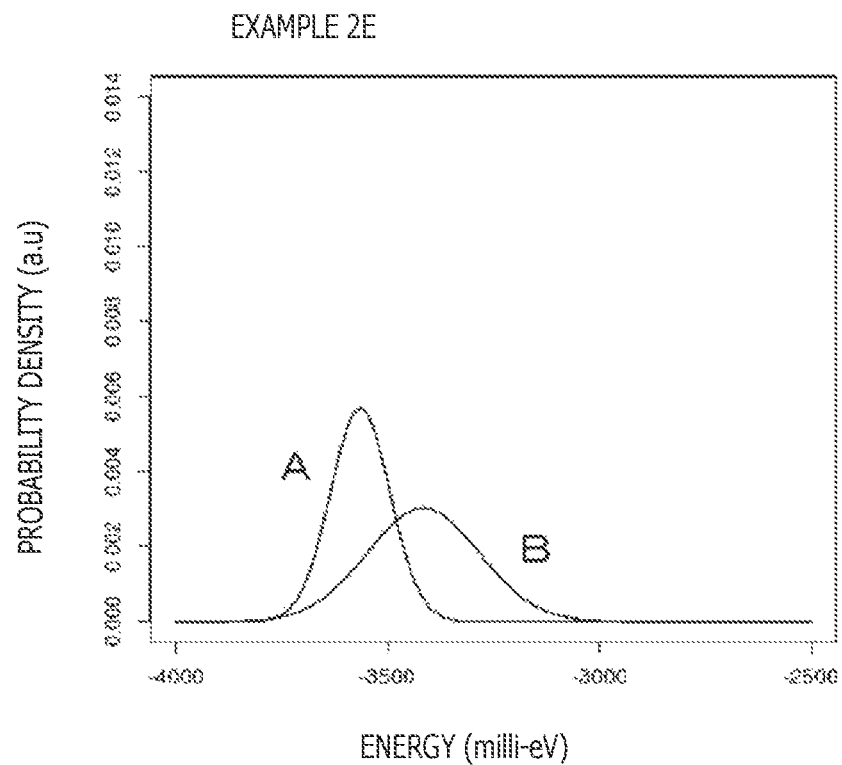

FIG.10
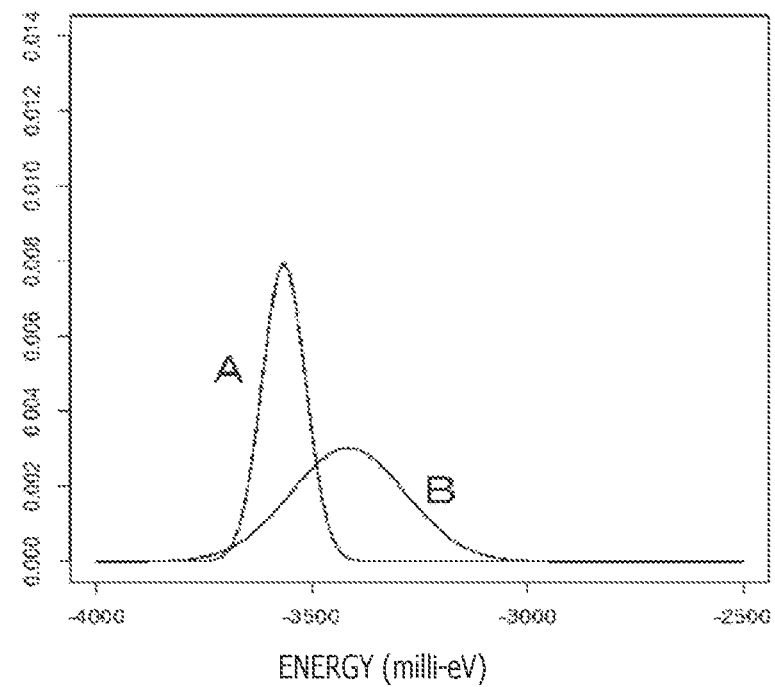
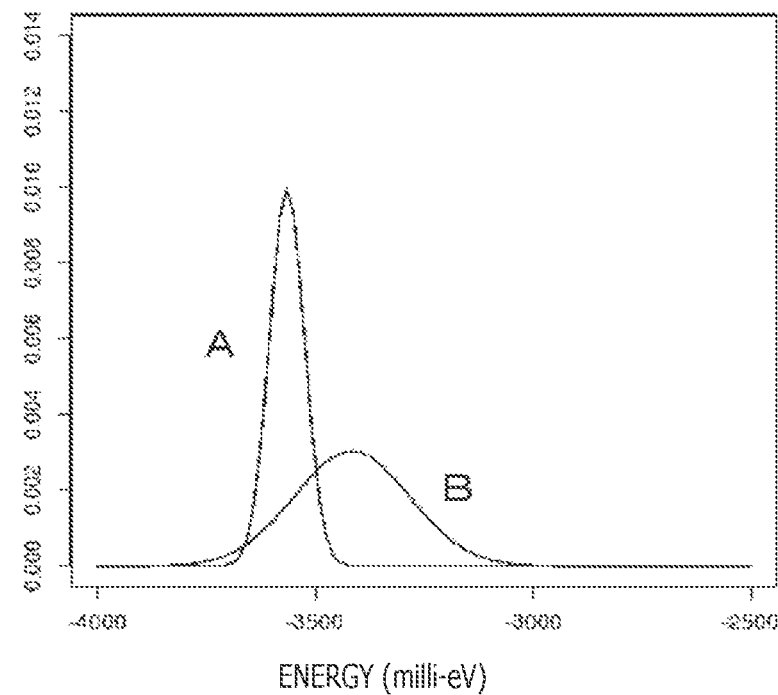

FIG.11
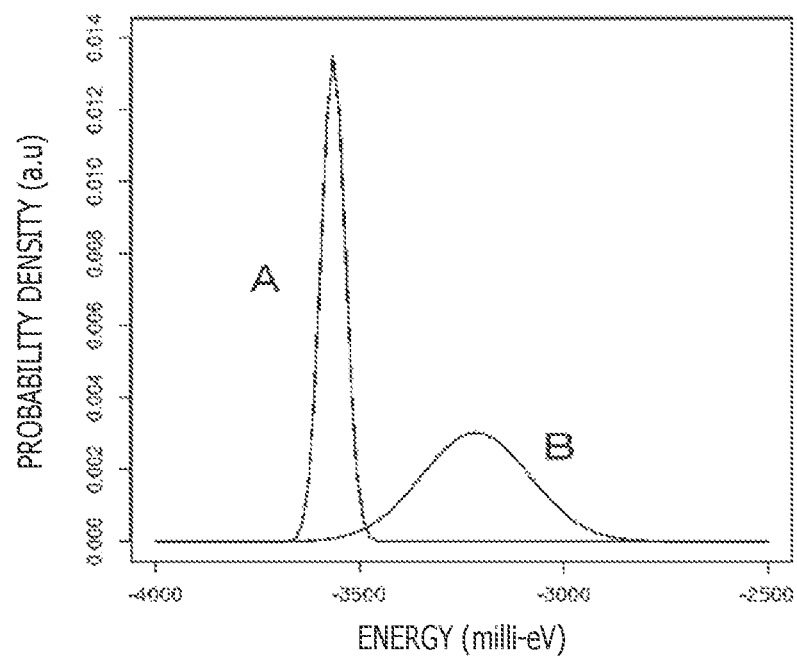
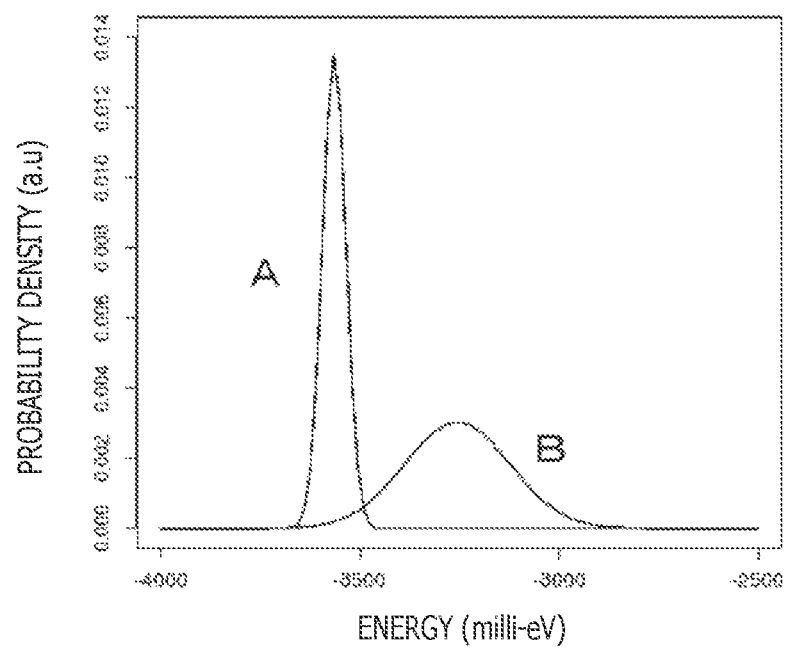

FIG. 12
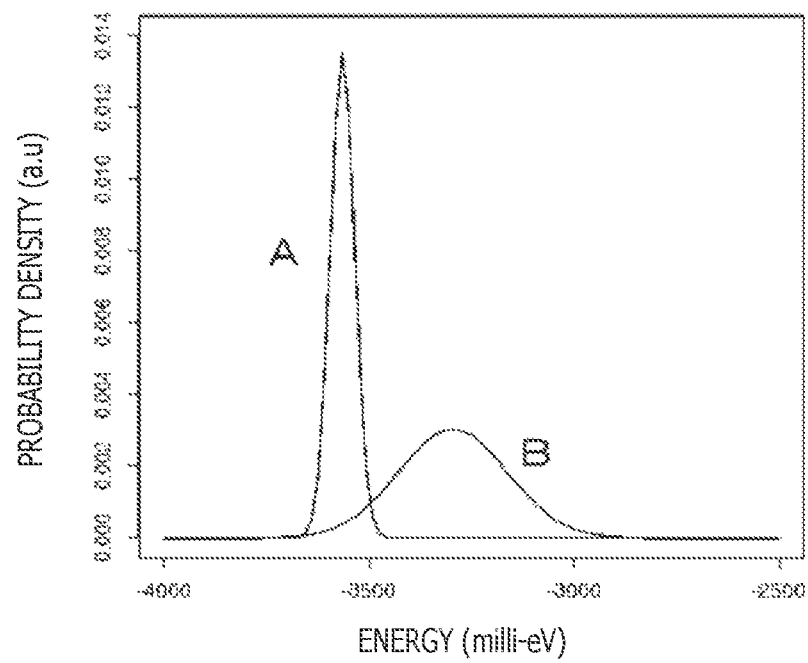
COMPARATIVE EXAMPLE 2D
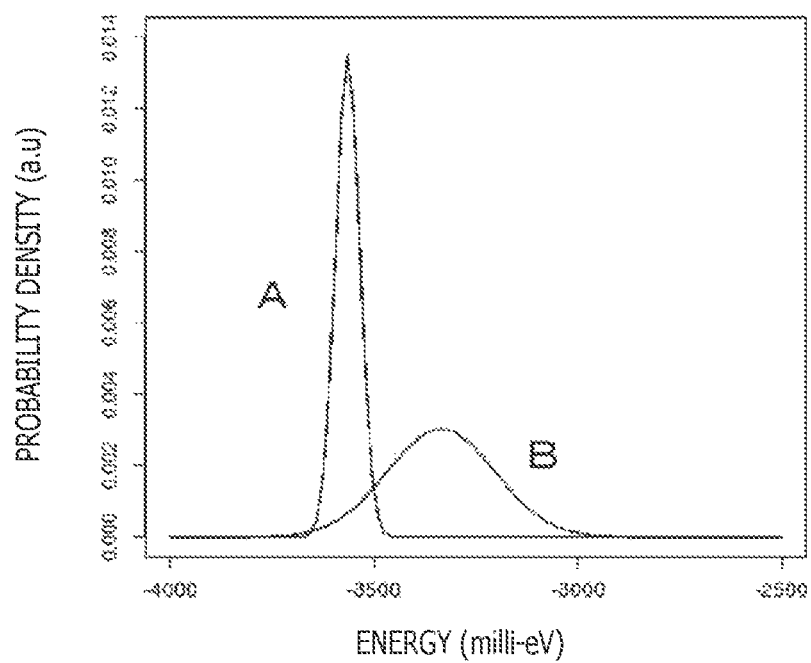
COMPARATIVE EXAMPLE 2E

FIG.13
COMPARATIVE EXAMPLE 2F
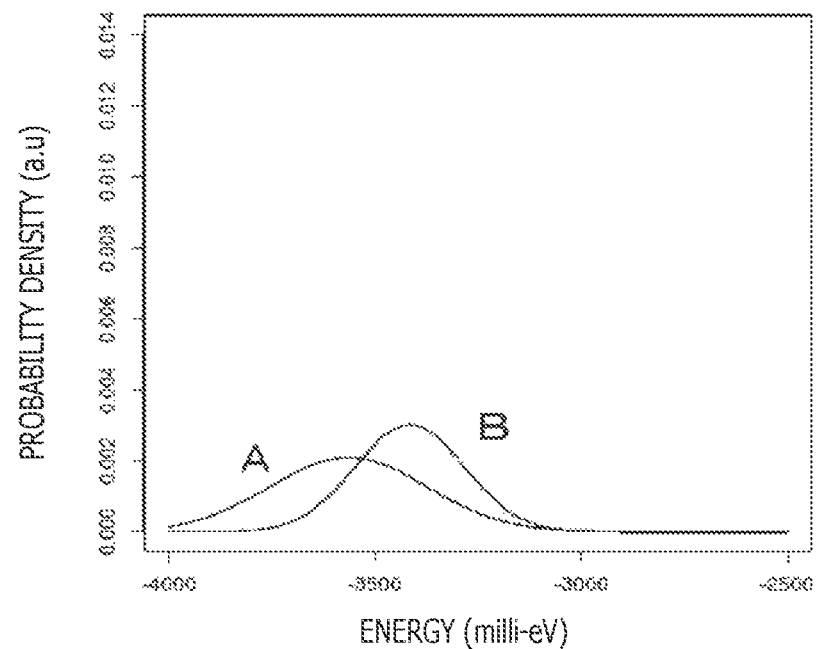
COMPARATIVE EXAMPLE 2G
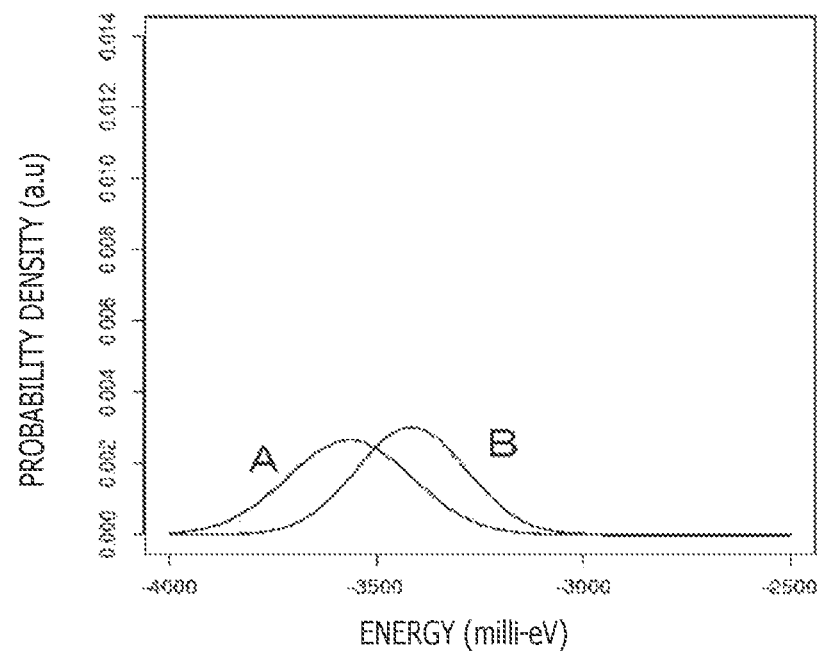

FIG.14
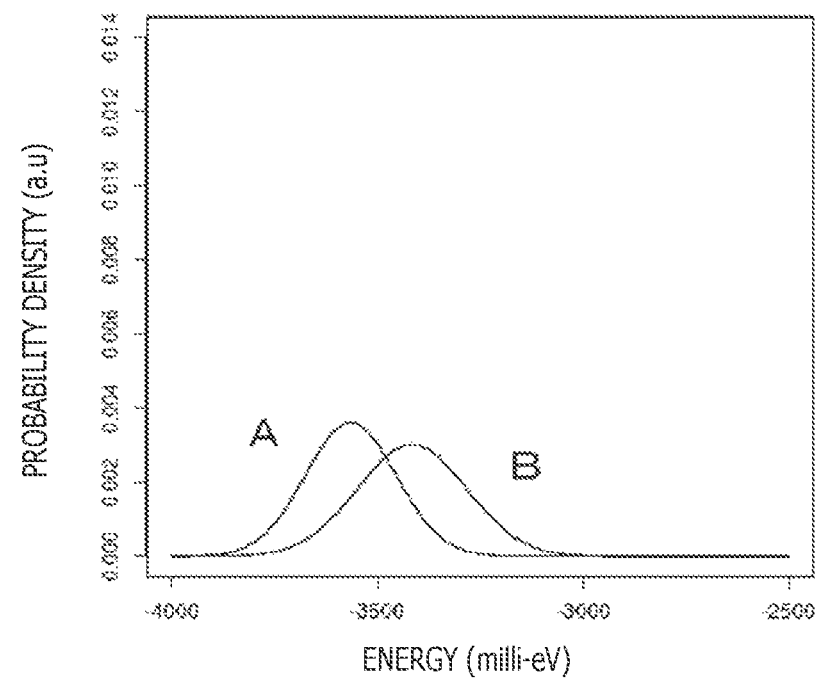
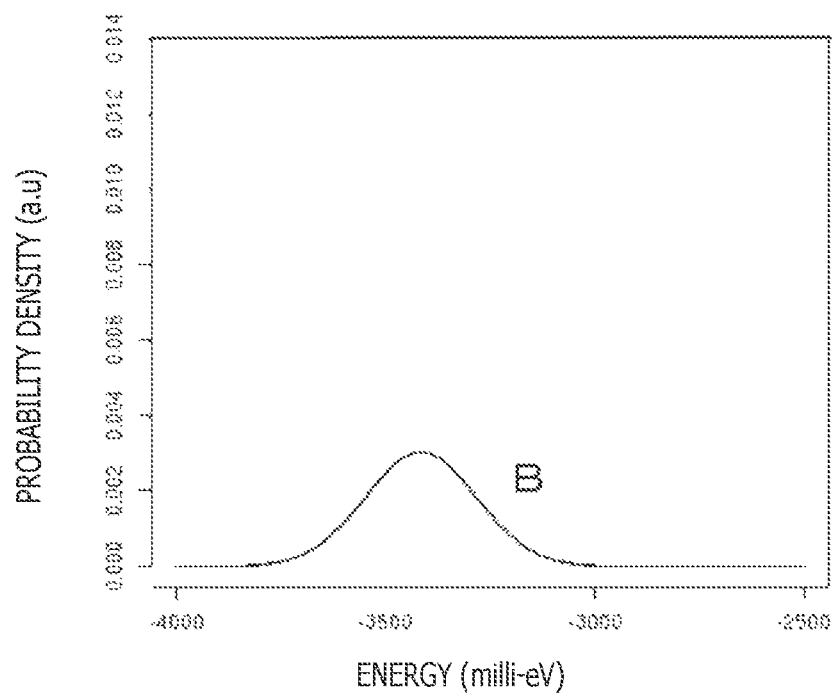

PHOTOELECTRIC CONVERSION ELEMENT, IMAGE PICKUP ELEMENT, LAMINATED IMAGE PICKUP ELEMENT, AND SOLID-STATE IMAGE PICKUP DEVICE USING AN ORGANIC MATERIAL HAVING DESIRED OPTICAL ABSORPTION PROPERTIES

TECHNICAL FIELD

The present disclosure relates to a photoelectric conversion element, an image pickup element, a laminated image pickup element, and a solid-state image pickup device.

BACKGROUND ART

An image pickup element using an organic material (organic photodiode) can photoelectrically convert only a specific color (wavelength band). Then, because of having such a feature, when the organic photodiode is used as an image pickup element in a solid-state image pickup device, a sub-pixel is constituted by a combination of an on-chip color filter (OCCF) and an image pickup element. It is possible to obtain a structure (laminated image pickup element) in which the sub-pixels are laminated on one another. Such a structure is impossible in a past solid-state image pickup device in which the sub-pixels are two-dimensionally arranged. Therefore, since incident light can be received at a high efficiency, the promotion of high sensitivity of the solid-state image pickup device is expected. In addition, since mosaic processing is not required, there is an advantage that a false color does not occur.

The organic photodiode used in the solid-state image pickup device and the image pickup element has the same or similar structure as or to that of various organic thin film solar cells. Heretofore, a structure utilizing p-n junction or p-i-n junction (for example, JP 2006-033942A), a structure utilizing a bulk-hetero structure (for example, JP 2007-123707A), and a structure utilizing a buffer layer (for example, JP 2007-311647A and JP 2007-088033A) has been well known as the structure of the organic photodiode, and have exclusively aimed at enhancing the photoelectric conversion efficiency.

CITATION LIST

Patent Literature

[PTL 1]
JP 2006-033942A
[PTL 2]
JP 2007-123707A
[PTL 3]
JP 2007-311647A
[PTL 4]
JP 2007-088033A

Non Patent Literature

[NPL 1]
Chem. Rev. 107, 953 (2007)

SUMMARY

Technical Problem

Now, a diffusion distance of excitons of the almost organic materials are 20 nm or less, and a conversion efficiency thereof is generally low as compared with that of the inorganic solar cell represented by silicon. In addition, in general, as compared with the case of the silicon system semiconductor material, the organic material is high in resistance, and low in mobility and carrier density (for example, refer to Chem. Rev. 107, 953 (2007)). Therefore, the organic photodiode has not yet depicted the characteristics which bears comparison with those of the photodiode using the past inorganic material represented by silicon. However, the organic material having a high absorption coefficient as compared with the photodiode using the silicon system semiconductor material exists, and thus the promotion of the high sensitivity is expected in the photodiode using such an organic material. Since the absorption coefficient is a physical quantity which is uniquely defined in silicon, the enhancement of the characteristics by the absorption coefficient cannot be attained in the photodiode using the silicon system semiconductor material.

Therefore, an object of the present disclosure is to provide an image pickup element (including a laminated image pickup element) and a photoelectric conversion element each using an organic material having excellent optical absorption properties, and a solid-state image pickup device provided with such an image pickup element.

Solution to Problem

An image pickup element according to a first aspect of the present disclosure for attaining the object described above or a photoelectric conversion element according to the first aspect of the present disclosure is constituted by laminating at least a first electrode, an organic photoelectric conversion layer, and a second electrode in order, and the organic photoelectric conversion layer includes a first organic semiconductor material having the following structural formula (1).

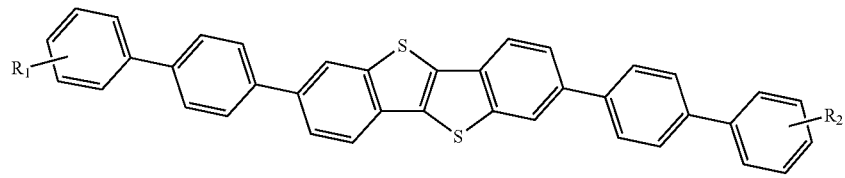

(1)

Here, $R_1$ and $R_2$ are each groups independently selected from hydrogen, an aromatic hydrocarbon group, a heterocyclic group, a halogenated aromatic group, or a fused heterocyclic group, and have an optional substituent, the aromatic hydrocarbon group is an aromatic hydrocarbon group selected from the group consisting of a phenyl group, a naphthyl group, an anthryl group, a phenanthryl group, a pyrenyl group, and a benzopyrenyl group, the heterocyclic group is a heterocyclic group selected from the group consisting of a pyridyl group, a pyradyl group, a pyrimidyl group, a quinolyl group, an isoquinolyl group, a pyrrolyl group, an indolenyl group, an imidazolyl group, a thienyl group, a furyl group, a pyranyl group, and a pyridonyl group, the halogenated aromatic group is a halogenated aromatic group selected from the group consisting of a phenyl group, a naphthyl group, an anthryl group, a phenanthryl group, a pyrenyl group, and a benzopyrenyl group, and the fused heterocyclic group is a fused heterocyclic group selected from the group consisting of a benzoquinolyl group, an anthraquinolyl group, and a benzothienyl group.

An image pickup element according to a second aspect of the present disclosure for attaining the object described above, or a photoelectric conversion element according to the second aspect of the present disclosure is constituted by laminating at least a first electrode, an organic photoelectric conversion layer, and a second electrode in order, and the organic photoelectric conversion layer includes a first organic semiconductor material having the following structural formula (2):

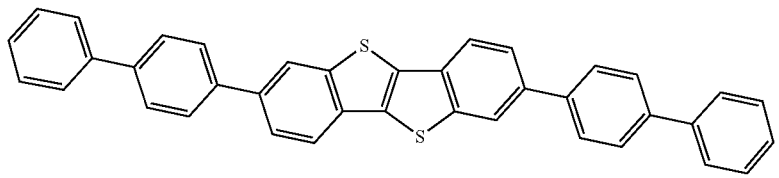

(2)

A laminated image pickup element of the present disclosure for attaining the object described above is constituted by laminating at least two image pickup elements according to the first aspect and the second aspect of the present disclosure.

A solid-state image pickup device according to a first aspect of the present disclosure for attaining the object described above is provided with a plurality of image pickup elements according to the first aspect and the second aspect of the present disclosure. In addition, a solid-state image pickup device according to a second aspect of the present disclosure for attaining the object described above is provided with a plurality of laminated image pickup elements of the present disclosure.

Advantageous Effect of Invention

In the image pickup element according to the first aspect and the second aspect of the present disclosure, the photoelectric conversion element according to the first aspect and the second aspect of the present disclosure, the image pickup element constituting the laminated image pickup element of the present disclosure, and an image pickup element constituting the solid-state image pickup device according to the first aspect and the second aspect of the present disclosure (hereinafter, those are collectively referred to as "the image pickup device, etc. of the present disclosure" in some cases), using the material expressed by either the structural formula (1) or the structural formula (2) and having the high hole mobility in the organic photoelectric conversion layer enables the photoelectric conversion efficiency and the carrier mobility to be greatly enhanced. It should be noted that the effect described in this description is merely the exemplification(s), and is by no means limited. In addition, the additional effect(s) may be offered.

BRIEF DESCRIPTION OF DRAWINGS

FIG. 8 is a view depicting a state of overlap of energy distributions of LUMO which is obtained based on the second organic semiconductor material and the third organic semiconductor material in Example 2B and Example 2C.

FIG. 9 is a view depicting a state of overlap of energy distributions of LUMO which is obtained based on the second organic semiconductor material and the third organic semiconductor material in Example 2D and Example 2E.

FIG. 10 is a view depicting a state of overlap of energy distributions of LUMO which is obtained based on the second organic semiconductor material and the third organic semiconductor material in Example 2F and Example 2G.

FIG. 11 is a view depicting a state of overlap of energy distributions of LUMO which is obtained based on the second organic semiconductor material and the third organic semiconductor material in Comparative Example 2B and Comparative Example 2C.

FIG. 12 is a view depicting a state of overlap of energy distributions of LUMO which is obtained based on the second organic semiconductor material and the third organic semiconductor material in Comparative Example 2D and Comparative Example 2E.

FIG. 13 is a view depicting a state of overlap of energy distributions of LUMO which is obtained based on the second organic semiconductor material and the third organic semiconductor material in Comparative Example 2F and Comparative Example 2G.

FIG. 14 is a view depicting a state of overlap of energy distributions of LUMO which is obtained based on the second organic semiconductor material and the third organic semiconductor material in Comparative Example 2H and Comparative Example 2I.

DESCRIPTION OF EMBODIMENTS

Figure 1:
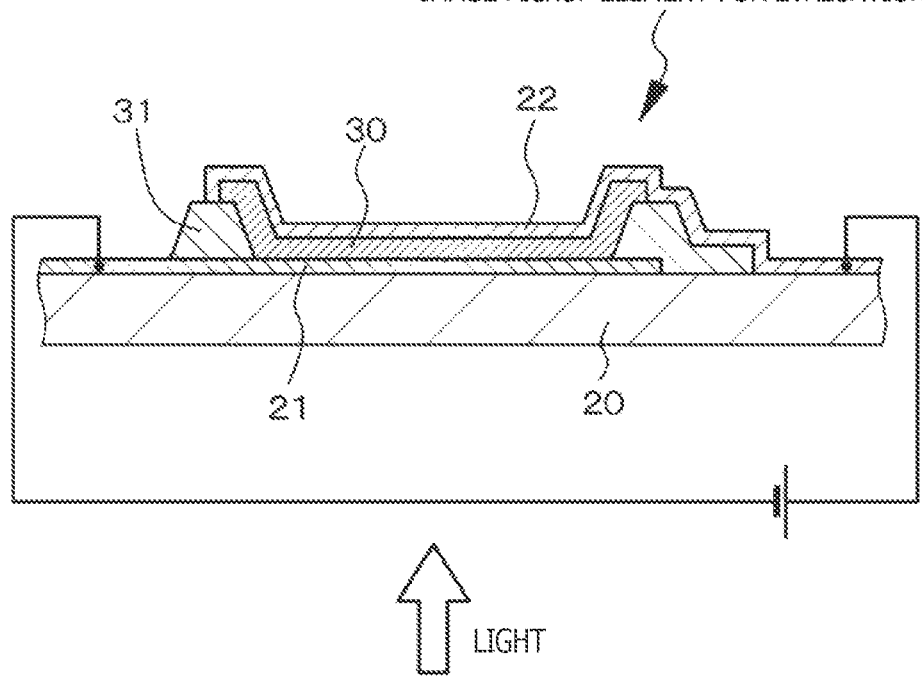
FIG. 1 is a schematic cross-sectional view of an image pickup element or a photoelectric conversion element of Example 1.

Hereinafter, although the present disclosure is described based on Examples with reference to the drawings, the present disclosure is by no means limited to Examples, and various numerical values and materials in Examples are exemplifications. It should be noted that a description will be given in the following order.
1. Description about whole of image pickup elements according to first aspect and second aspect of present disclosure, photoelectric conversion elements according to first aspect and second aspect of present disclosure, laminated image pickup element of present disclosure, and solid-state image pickup devices according to first aspect and second aspect of present disclosure.
2. Example 1 (image pickup elements and photoelectric conversion elements of present disclosure according to first aspect and second aspect of present disclosure, and solid-state image pickup device according to first aspect of present disclosure)
3. Example 2 (modified changes of Example 1)
4. Example 3 (laminated image pickup element of present disclosure and solid-state image pickup device according to second aspect of present disclosure)
5. Others
<Description about whole of image pickup elements according to first aspect and second aspect of present disclosure, photoelectric conversion elements according to first aspect and second aspect of present disclosure, laminated image pickup element of present disclosure, and solid-state image pickup devices according to first aspect and second aspect of present disclosure>

In an image pickup element, etc. of the present disclosure,
an organic photoelectric conversion layer further includes a second organic semiconductor material,
the second organic semiconductor material can be made to have a form constituted by fullerene (such as higher fullerene such as C60, C70 or C74, or endohedral fullerene) or a fullerene derivative (such as a modified fullerene compound such as a fullerene fluoride or a fullerene multimers). In the following, for convenience, the materials having a structural formula (1) and a structural formula (2) constituting the organic photoelectric conversion layer are collectively referred as "a benzothienobenzothiophene system organic material in the present disclosure." Here, if the benzothienobenzothiophene system organic material in the present disclosure is used as a p-type semiconductor material, and fullerene (C60, C70) is used as an n-type semiconductor material, then, as compared with the past image pickup element or photoelectric conversion element, a higher quantum efficiency (external conversion efficiency, EQE), and higher carrier mobility can be attained. Although fullerene has a high electron transport property in terms of the n-type semiconductor material, fullerene has high symmetry (soccer-ball-shape) in the three-dimensional direction, and the characteristics of the image pickup element or the photoelectric conversion element largely depends on the character of the p-type semiconductor material with which fullerene is combined. The combination of the benzothienobenzothiophene system organic material and fullerene in the present disclosure is a very preferable combination. It should be noted that although the organic semiconductors are classified into a p-type and an n-type in many cases, the p-type means that it readily transports the holes, and the n-type means that it readily transports the electrons. Thus, the organic semiconductors are not limited to the interpretation that the organic semiconductor has the holes or electrons as the majority carrier in the thermal excitation like the inorganic semiconductors. The group or the like contained in a fullerene derivative can include: a halogen atom; a straight chain, branched or cyclic alkyl group or phenyl group; a group having a straight chain or condensed aromatic compound; a group having a halide; a partial fluoroalkyl group; a perfluoroalkyl group; a cyrilalkyl group; a cyrilalkoxy group; an allycyril group; an allylsulfanyl group; an alkylsulfide group; an allylsulphonyl group; an alkylsulphonyl group; an allylsulfany group; an alkylsulfide group; an amino group; an alkylamino group; an allylamino group; a hydroxy group; an alkoxy group; an acylamino group; an acyloxy group; a carbonyl group; a carboxy group; a carboxythoamido group; a carboalkoxy group; an acyl group; a sulfonyl group; a cyano group; a nitro group; a group having a chalcogenide; a phosphine group; a phosphonate group; and a derivative thereof.

Alternatively, in the image pickup element, etc. of the present disclosure,
the organic photoelectric conversion layer further includes a second organic semiconductor material and a third semiconductor material,
the second organic semiconductor material includes fullerene or a fullerene derivative,
a value $\mu_3$ of a line absorption coefficient in a local maximum optical absorption wavelength in a visible light region of the third organic semiconductor material can be configured to be larger than a value $\mu_1$ of a line absorption coefficient in a local maximum optical absorption wavelength in a visible light region of the first organic semiconductor material, and configured to be larger than a value $\mu_2$ of a line absorption coefficient in a local maximum optical absorption wavelength in a visible light region of the second organic semiconductor material. As a result, the light (photons) made incident to the organic photoelectric conversion layer can be selectively absorbed by the third organic semiconductor material having the larger line absorption coefficient. After the photons absorbed in the third organic semiconductor material turn into excitons, the resulting excitons cause the exciton separation in an interface between the first organic semiconductor material and the third organic semiconductor material, or an interface between the second organic semiconductor material and the third organic semiconductor material, or an interface between the first organic semiconductor material and the second organic semiconductor material, and the third organic semiconductor material, thereby enabling the carriers of the holes and the electrons to be generated. The carriers thus generated (holes and electrons) are efficiently transmitted to electrodes based on the high hole mobility which the first organic semiconductor material has, and the high electron mobility which the second organic semiconductor material has. Then, the holes and the electrons which reach the respective electrodes are detected in the form of photocurrents. A generation probability of the photocurrent to the incident photons is generally called the photoelectric conversion efficiency. Therefore, by regulating the values $\mu_1$, $\mu_2$, and $\mu_3$ of the line absorption coefficients, the light can be selectively, effectively absorbed in the third organic semiconductor material. The high photoelectric conversion efficiency can be attained in accordance with such a principle. The line absorption coefficient can be calculated based on such a method as to obtain an absorption rate (%) of the photons to the wavelength by using an ultraviolet and visible spectrophotometer, and obtain a thickness by using a stylus-type roughness meter in a thin film of the organic semiconductor material. Then, in such a constitution, it is possible to adopt a constitution in which the excitons generated by the optical absorption in the third organic semiconductor material are subjected to the exciton separation in the interface between the first organic semiconductor material and the second organic semiconductor material, and the third organic semiconductor material, or both the interfaces between the organic semiconductor materials selected from two of the first organic semiconductor material, the second organic semiconductor material, and the third organic semiconductor material or the excitons generated by the optical absorption in the third organic semiconductor material are subjected to the exciton separation in the interface of one kind of organic semiconductor material selected from the first organic semiconductor material, the second organic semiconductor material, and the third organic semiconductor material. Then, in those constitutions, it is possible to adopt a constitution in which the exciton charge separation rate at which the excitons are subjected to the exciton separation is $1 \times 10^{10}$ s$^{-1}$ or more. Moreover, in those constitutions, it is possible to adopt a constitution in which the organic photoelectric conversion layer has a local maximum optical absorption wavelength in the range of 450 nm or more to 650 nm or less. Furthermore, in those constitutions, it is possible to adopt a constitution in which the third organic semiconductor material includes subphthalocyanine expressed by the following structural formula (10), and a subphthalocyanine system derivative. Here, specifically, the subphthalocyanine system derivative can include the following structural formula (11). More specifically, the subphthalocyanine system derivative can include the following structural formula (12) abbreviated as "SubPc-Cl," the following structural formula (13) abbreviated as "SubPc-F," the following structural formula (14) abbreviated as "SubPc-OC6F5," the following structural formula (15) abbreviated as "F12SubPc-Cl," the following structural formula (16) abbreviated as "F6SubPc-Cl," the following structural formula (17) abbreviated as "F6SubPc-F," and the following structural formula (18) abbreviated as "F6SubPc-OC6F5."

Here, since the subphthalocyanine system derivative has the high line absorption coefficient, the subphthalocyanine system derivative is used, thereby enabling the third organic semiconductor material to more selectively absorb the light to generate the excitons. Furthermore, in those constitutions, it is possible to adopt a constitution in which:

the organic photoelectric conversion layer further includes a fourth organic semiconductor material; and the fourth organic semiconductor material is provided with a mother skeleton similar to that of the first organic semiconductor material, or the fourth organic semiconductor material has the same mother skeleton as that of the second organic semiconductor material or the third organic semiconductor material, and is provided with a different substituent. By adopting such a constitution, the spectral characteristics of the visible region can be made more readily desired characteristics. However, if the fourth organic semiconductor material has any of the hole transport ability which the first organic semiconductor material has, the high electron transport ability which the second organic semiconductor material has, and the large line absorption coefficient which the third organic semiconductor material has, then, a molecular structure is not especially limited.

The fourth organic semiconductor material provided with the mother skeleton similar to that of the first organic semiconductor material can include the following structural formula (101) and structural formula (102). A concrete example of the structural formula (101) and structural formula (102) can include a structural formula (103) to a structural formula (115).

(101)

(102)

Here, in the structural formula (101) and the structural formula (102) as an acenedichalcogenophen derivative, Ar$^1$ represents any of acene group including a benzene ring, a naphthalene ring, an anthracene ring, and the like, and Y represents an oxygen atom, a sulfur atom or a selenium atom. In addition, two different atoms other than a carbon atom may be contained in a five-membered ring. Specifically, an acenethiazole derivative (S and N) and an oxazole derivative can be exemplified.

(103)

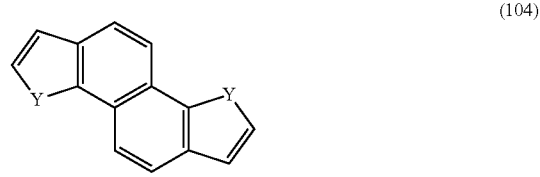

(104)

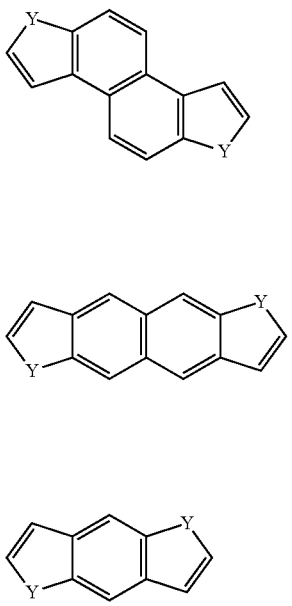

(105)
(106)
(107)
(108)
(109)
(110)
(111)

Here, in a structural formula (103) to a structural formula (111), Y represents an oxygen atom, a sulfur atom or a selenium atom.

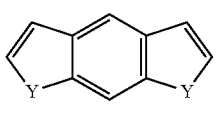

(112)

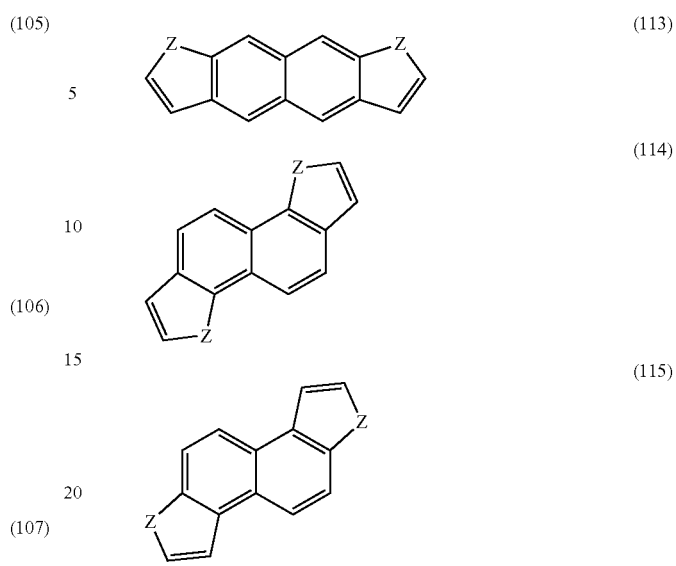

(113)
(114)
(115)

Here, in a structural formula (112) to a structural formula (115), Z represents an oxygen atom, a sulfur atom or a selenium atom.

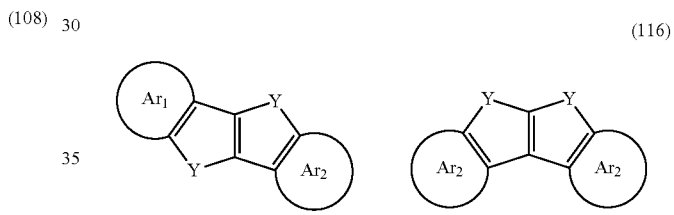

(116)

Here, the structural formula (1) and the structural formula (2) as the benzothienobenzothiophene system organic material are a part of a chalcogenochalcogenphene derivative. $Ar_1$ and $Ar_2$ represent any of acene group including a benzene ring, a naphthalene ring, an anthracene ring, and the like (or, $Ar_1$ and $Ar_2$ represent the same fused ring, and specifically, represent any of acene group including a benzene ring, a naphthalene ring, an anthracene ring, and the like). Y represents an oxygen atom, a sulfur atom or a selenium atom. In addition, two different atoms other than a carbon atom may be contained in a five-membered ring. Specifically, an acenethiozole derivative (S and N) and an oxazole derivative can be exemplified. It is known that a group of these materials exhibits the high hole mobility (for example, refer to JP 2014-036039A).

In addition, the fourth organic semiconductor material having the same mother skeleton as that of the second organic semiconductor material, and provided with a substituent different therefrom can include Phenyl-Butyric Acid Methyl Ester (PCBM) of C60 or C70. In addition, the fourth organic semiconductor material having the same mother skeleton as that of the third organic semiconductor material, and provided with a substituent different therefrom can include structures of the structural formula (10) to the structural formula (25) (however, having the structure different from that of the third organic semiconductor material).

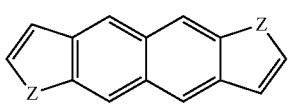

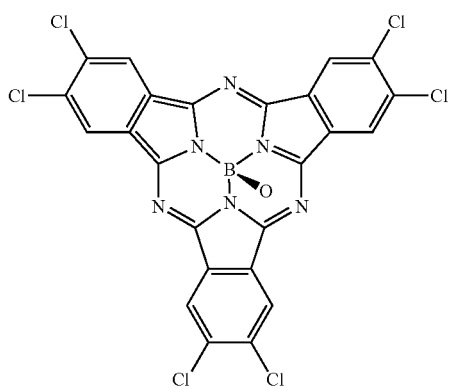

(19)

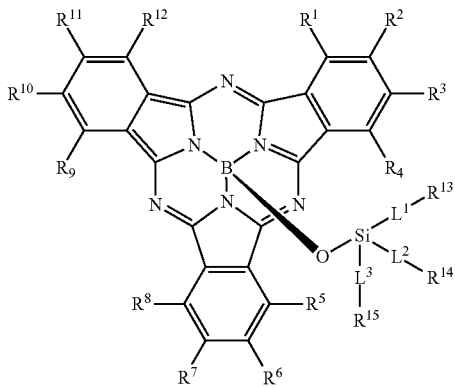

(23)

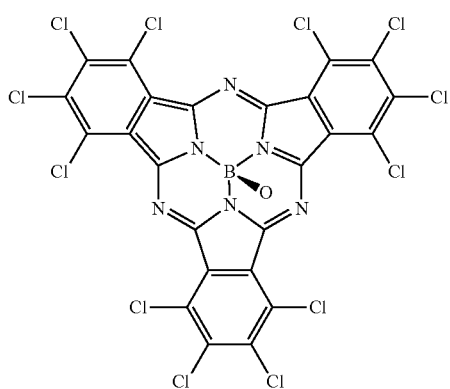

(20)

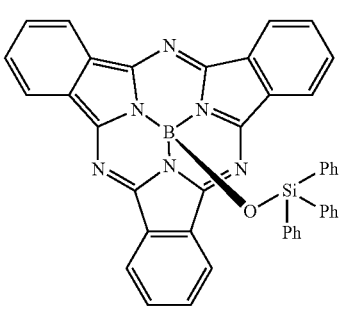

(24)

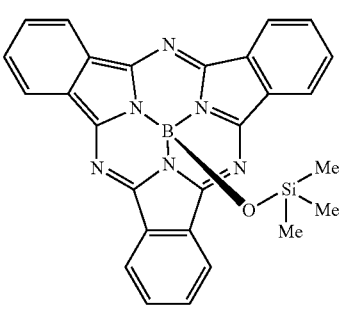

(25)

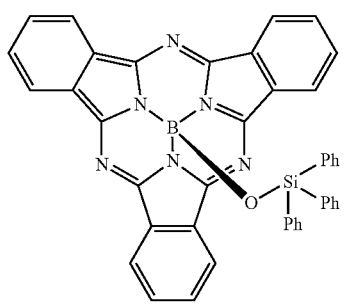

(21)

(22)

Alternatively, in the image pickup element, etc. of the present disclosure, it is possible to adopt a constitution in which the organic photoelectric conversion layer further includes a second organic semiconductor material and a third organic semiconductor material; an area of a portion in which an energy distribution state density of HOMO or LUMO of the second organic semiconductor material, and an energy distribution state density of HOMO or LUMO of the third organic semiconductor material overlap each other is 0.15 meV or more. Then, in this case, it is possible to adopt a constitution in which an energy distribution σ of the third organic semiconductor material or an energy distribution σ of the second organic semiconductor material is 70 meV or less. Furthermore, in these cases, it is possible to adopt a constitution in which the second organic semiconductor material, for example, includes fullerene or the fullerene derivative described above. Furthermore, in these cases, it is possible to adopt a constitution in which the third organic semiconductor material, for example, includes a subphthalocyanine system derivative represented by the structural formula (10) to the structural formula (18).

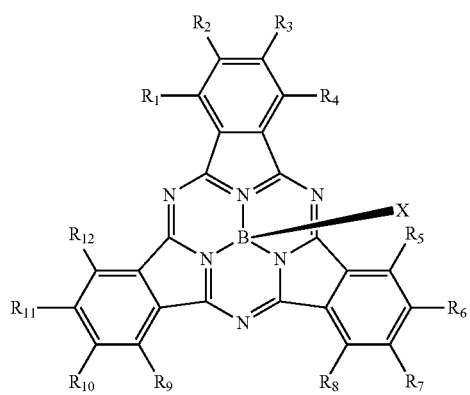

(10)

However, X and $R_1$ to $R_{12}$ are each at least one group independently selected from the group consisting of a hydrogen atom; a halogen atom containing chlorine and fluorine; or a straight chain, branched or cyclic alkyl group or a phenyl group; a straight chain or fused aromatic ring; a partial fluoroalkyl group; a perfluoroalkyl group; a silylalkyl group; a cyrilalkoxy group; an allylsilyl group, a thioalkyl group; a thioaryl group; an allylsulfanyl group; an alkylsulfanyl group; an amino group; an alkylamino group; an allylamino group; a hydroxyl group; an alkoxy group; an acylamino group; an acyloxy group; a carboxy group; a carboxythoamido group; a carboalkoxy group; an acyl group; a sulfonyl group; a cyano group; and a nitro group.

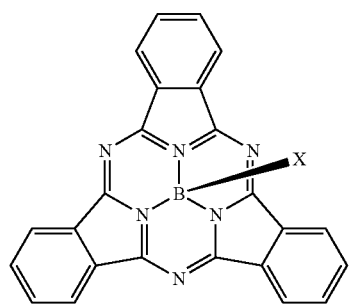

(11)

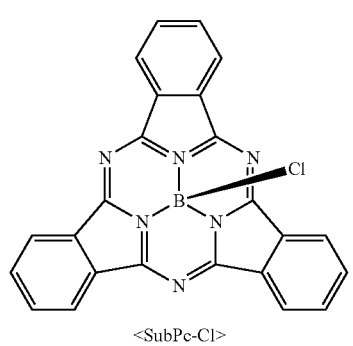

(12)

<SubPc-Cl>

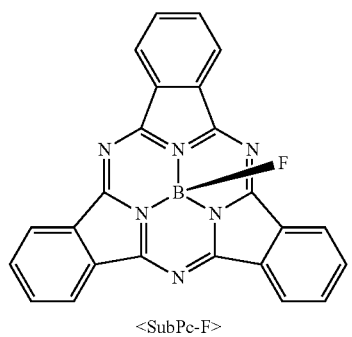

(13)

<SubPc-F>

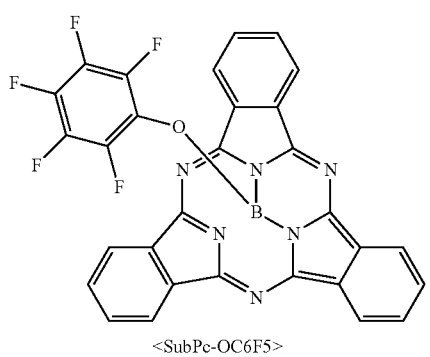

(14)

<SubPc-OC6F5>

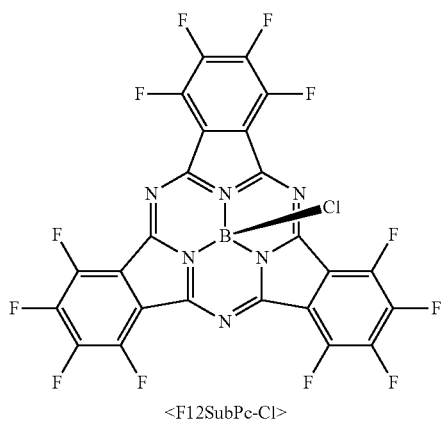

(15)

<F12SubPc-Cl>

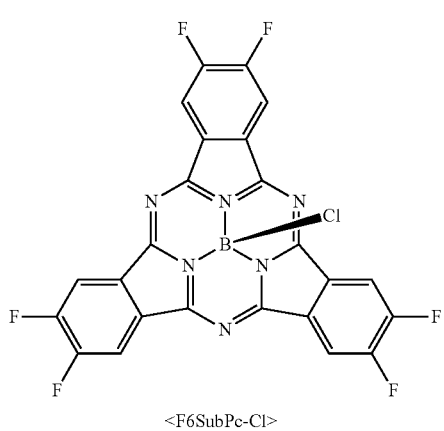

(16)

<F6SubPc-Cl>

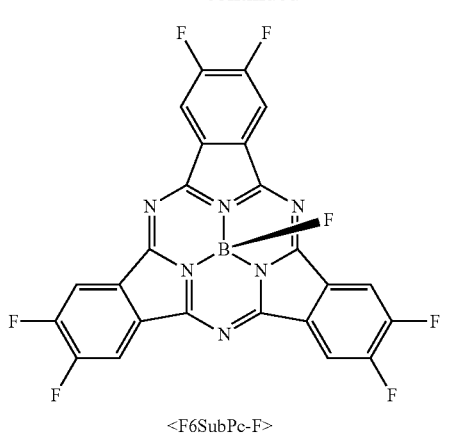

<F6SubPc-F> (17)

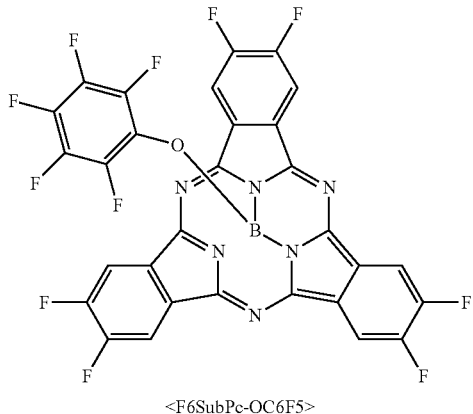

<F6SubPc-OC6F5> (18)

In the image pickup element, etc. of the present disclosure including the various preferred forms and constitutions described so far, it is desirable that the hole mobility of the first organic semiconductor material is $1\times10^{-5}$ cm$^2$/V·s or more, preferably $1\times10^{-4}$ cm$^2$/V·s or more, and more preferably $1\times10^{-2}$ cm$^2$/V·s or more.

In the image pickup element, etc. of the present disclosure including the various preferred forms and constitutions described so far, a first electrode and a second electrode can be configured to include a transparent conductive material(s). Alternatively, one of the first electrode and the second electrode can be configured to include a transparent conductive material, and the other can be configured to include a metallic material.

In the image pickup element, etc. of the present disclosure including the various preferred forms and constitutions described so far, it is preferable that the electrode on the light incidence side is configured to include a transparent conductive material. Such an electrode is referred to as "a transparent electrode." Here, an indium-tin oxide (including ITO, Sn-doped In$_2$O$_3$, crystalline ITO, and amorphous ITO), IFO (F-doped In$_2$O$_3$), a tin oxide (SnO$_2$), ATO (Sb-doped SnO$_2$), FTO (F-doped SnO$_2$), a zinc oxide (including Al-doped ZnO, B-doped ZnO, and Ga-doped ZnO), an indium oxide-a zinc oxide (IZO), a titanium oxide (TiO$_2$), a spinel-type oxide, and an oxide having a YbFe$_2$O$_4$ structure can exemplified as the transparent conductive material constituting the transparent electrode. A method of forming the transparent electrode, although depending on the material constituting the transparent electrode, can include a physical vapor deposition method (PVD method) such as a vacuum evaporation method, a reactive evaporation method, various sputtering methods, an electron beam evaporation method, and an ion plating method, various chemical vapor deposition methods (CVD methods) including a pyrosol process, a method of thermally decomposing an organic metallic compound, a spraying method, a dipping method, and an MOCVD method, a nonelectrolytic plating method, and an electrolytic plating method. In some cases, as described above, the other electrode may also be configured to include a transparent conductive material.

In the case where the transparency is unnecessary, when as far as the conductive material constituting the first electrode or the second electrode, the first electrode or the second electrode is made to function as a cathode electrode (cathode), that is, function as an electrode from which the holes are taken out, the cathode electrode preferably includes a conductive material having a high work function (for example, $\Phi$=4.5 eV to 5.5 eV). Specifically, it is possible to exemplify gold (Au), silver (Ag), chromium (Cr), nickel (Ni), palladium (Pd), platinum (Pt), iron (Fe), iridium (Ir), germanium (Ge), Osmium (Os), rhenium (Re), and tellurium (Te). On the other hand, when the first electrode or the second electrode is made to function as an anode, that is, function as an electrode from which the electrons are taken out, the anode preferably includes a conductive material having a low work function (for example, $\Phi$=3.5 eV to 4.5 eV). Specifically, it is possible to give an alkaline a metal (such as Li, Na, or K) and a fluoride or oxide thereof, an alkaline earth metal (such as Mg or Ca) and a fluoride or oxide thereof, aluminum (Al), zinc (Zn) tin (Sn), thallium (Tl), a sodium-kalium alloy, an aluminum-lithium alloy, a magnesium-silver alloy, a rare earth metal such as indium or ytterbium, or an alloy thereof. Alternatively, the material constituting the first electrode or the second electrode can include a metal such as platinum (Pt), gold (Au), palladium (Pd), chromium (Cr), nickel (Ni), aluminum (Al), silver (Ag), tantalum (Ta), tungsten (W), copper (Cu), titanium (Ti), indium (In), tin (Sn), iron (Fe), cobalt (Co), and molybdenum (Mo), or conductive materials such as alloys containing these metal elements, conductive particles including these metals, conductive particles of alloys containing these metals, polysilicon containing an impurity, a carbon system material, a semiconductor oxide, a carbon nanotube, and graphene. In addition, it is possible to adopt the laminated structure of the layers containing these elements. Moreover, the materials constituting the first electrode and the second electrode can include a material (conductive polymer) such as poly(3,4-ethylene dioxythiophene)/polystyrene sulfonic acid [PEDOT/PSS]. In addition, these conductive materials may be mixed with binder (polymer) to produce paste or ink which may be in turn cured to be used as the electrode.

A method of forming the first electrode and the second electrode, although depending on the materials constituting those, can include a combination of any one of various kinds of PVD methods which will be described later; various kinds of CVD methods including an MOCVD method; various paint-on method which will be described later; a lift-off method; a sol-gel method; an electrodeposition method; a shadow mask method; plating methods such as an electrolytic plating method and a nonelectrolytic plating method or a combination thereof; and a spraying method, and a patterning technique as may be necessary. The surfaces of the first electrode and the second electrode can be processed with oxygen plasma, argon plasma, nitrogen plasma, ozone or the like. These pieces of processing can be carried out irrespective of presence or absence of a coating layer (which will be described later), or before or after the coating.

Moreover, in the image pickup element, etc. of the present disclosure including the preferred forms and constitutions described so far, it is possible to adopt a constitution in which a wavelength of an optical absorption peak in an optical absorption spectrum of the organic photoelectric conversion layer falls within a visible light region. Moreover, in the image pickup element, etc. of the present disclosure including the preferred forms and constitutions described so far, it is possible to adopt a constitution in which an optical absorption spectrum of the organic photoelectric conversion layer has one local maximum value in the visible light region.

Moreover, in the image pickup element, etc. of the present disclosure including the preferred forms and constitutions described so far, it is desirable that an absorption coefficient α ($cm^{-1}$) of the organic photoelectric conversion layer is $1 \times 10^5$ or more, preferably $1.5 \times 10^5$ or more, more preferably $2 \times 10^5$ or more, and still more preferably $2.5 \times 10^5$ or more. In addition, in the image pickup element, etc. of the present disclosure including the preferred forms and constitutions described so far, a sublimation temperature under the atmosphere of the material(s) constituting the organic photoelectric conversion layer is desirably 250° C. or more. In addition, 2,000 or less, preferably 500 to 1,500, and more preferably 500 to 1,000 can be exemplified as a molecular weight of the whole organic photoelectric conversion layer constituting the image pickup element, etc. of the present disclosure.

In the image pickup element, etc. of the present disclosure, a p-type organic optical absorption material or organic transparent material, and/or an n-type organic optical absorption material or organic transparent material may be further contained in the organic photoelectric conversion layer. The p-type organic optical absorption material organic transparent material, and/or an n-type organic optical absorption material or organic transparent material can include an aromatic monocyclic system compound, an aromatic fused ring system compound, a heteromonocyclic system compound, a fused heterocyclic system compound, a polymethine system compound, a π conjugated low-molecular-weight system compound, a carbonium compound, a styryl system compound, a stilbene system compound, a metal complex system compound, a π conjugated polymer system compound, a σ conjugated system compound, a dye-containing polymeric system compound, and a polymer complex system compound. That is to say, the organic photoelectric conversion layer can include forms such as:

(A) A form in which a benzothienobenzothiophene system organic material having a p-type in the present disclosure is contained (B) A form in which a benzothienobenzothiophene system organic material having a p-type in the present disclosure, and fullerene or a fullerene derivative each having a p-type in the present disclosure is contained (C) A form in which a benzothienobenzothiophene system organic material having a p-type in the present disclosure, and a fullerene derivative each having a p-type in the present disclosure, and a p-type organic optical absorption material or organic transparent material, and/or an n-type organic optical absorption material or organic transparent material are contained (D) A form in which a benzothienobenzothiophene system organic material having a p-type in the present disclosure, and fullerene or a fullerene derivative each having a p-type in the present disclosure, and a p-type organic optical absorption material or organic transparent material, and/or an n-type organic optical absorption material or organic transparent material are contained (E) A form in which an acenedichalcogenophene system organic material having a p-type is contained (F) A form in which an acenedichalcogenophene system organic material having a p-type, and fullerene or a fullerene derivative having a p-type are contained.

(G) A form in which an acenedichalcogenophene system organic material having a p-type, and fullerene or a fullerene derivative having a p-type, and a p-type organic optical absorption material or organic transparent material, and/or an n-type organic optical absorption material or organic transparent material are contained (H) A form in which an acenedichalcogenophene system organic material having a p-type, and a p-type organic optical absorption material or organic transparent material, and/or an n-type organic optical absorption material or organic transparent material are contained. It should be noted that hereinafter, these eight forms are generally referred to as "a p-type organic material in the present disclosure" in some cases.

The aromatic monocyclic system compound, specifically, can include a triallyl amine system compound and a derivative thereof, a biphenyl system compound and a derivative thereof, and a diphenoquinone system compound and a derivative thereof.

The aromatic fused ring system compound, specifically, can include an acene system compound represented by naphthalene, anthracene, and pentacene and a derivative thereof, a rubrene system compound and a derivative thereof, a phenanthrene system compound and a derivative thereof, a fluoranthene system compound and a derivative thereof, a triphenylene system compound and a derivative thereof, a pyrene system compound and a derivative thereof, a chrysene system compound and a derivative thereof, a perylene system compound and a derivative thereof, a coronene system compound and a derivative thereof, an indene system compound and a derivative thereof, a bianthyl system compound and a derivative thereof, a toriantoriren system compound and a derivative thereof, a fluoranthene system compound and a derivative thereof, an aceanthrylene system compound and a derivative thereof, a pentaphene system compound and a derivative thereof, a tetra-phenylene system compound and a derivative thereof, a pero-pyrene system compound and a derivative thereof, a terylene system compound and a derivative thereof, a bisanthrylene system compound and a derivative thereof, a quaterterylene system compound and a derivative thereof, an indane system compound and a derivative thereof, and a rubicene system compound and a derivative thereof.

The heteromonocylic system compound, specifically, can include a thiophene system compound and a derivative thereof, a pyrazoline system compound and a derivative thereof, an azole system compound and a derivative thereof, an oxazole system compound and a derivative thereof, an oxadiazole system compound and a derivative thereof, a pyrane system compound and a derivative thereof, a thio-pyrane system compound and a derivative thereof, a pyrazine system compound and a derivative thereof, a thiazole system compound and a derivative thereof, a pyrrole system compound and a derivative thereof, a triazole system compound and a derivative thereof, a squarylium system compound and a derivative thereof, a lactam system compound and a derivative thereof, an azobenzene system compound and a derivative thereof, a quinone system compound and a derivative thereof, a furan system compound and a derivative thereof, an azole system compound and a derivative thereof, a pyrrolidone system compound and a derivative thereof, a silole system compound and a derivative thereof, an oxazoline system compound and a derivative thereof, an imidazole system compound and a derivative thereof, a pyrazoline system compound and a derivative thereof, a pyridine system compound and a derivative thereof, a bipyridine system compound and a derivative thereof, a pyridazine system compound and a derivative thereof, a dithiol system compound and a derivative thereof, and a dioxyborane system compound and a derivative thereof.

The fused heterocyclic system compound, specifically, can include a pyrrolopyrrole system compound and a derivative thereof, a diazabicyclo system compound and a derivative thereof, a phthalide system compound and a derivative thereof, a benzoxazole system compound and a derivative thereof, a benzothiophene system compound and a derivative thereof, a benzothiazole system compound and a derivative thereof, an indole system compound and a derivative thereof, an imidazopyridine system compound and a derivative thereof, a benzoazole system compound and a derivative thereof, a benzopyran system compound and a derivative thereof, a coumarin system compound and a derivative thereof, a chromone system compound and a derivative thereof, an azacoumarin system compound and a derivative thereof, a quinolone system compound and a derivative thereof, a benzoxazine system compound and a derivative thereof, a phthalazine system compound and a derivative thereof, a quinazoline system compound and a derivative thereof, a quinoxalline system compound and a derivative thereof, a pyrimidopyrimidine system compound and a derivative thereof, a dibenzofuran system compound and a derivative thereof, a carbazole system compound and a derivative thereof, a pyrazoquinoline system compound and a derivative thereof, a naphthalimide system compound and a derivative thereof, a benzquinoline system compound and a derivative thereof, a phenanthridinne system compound and a derivative thereof, a phenanthroline system compound and a derivative thereof, a phenazine system compound and a derivative thereof, a pyridoquinoline system compound and a derivative thereof, a dipyrimidopyrimidine system compound and a derivative thereof, a teazaflavin system compound and a derivative thereof, a dioxazine system compound and a derivative thereof, a pyrimidoquinazoline system compound and a derivative thereof, a phenanthazole system compound and a derivative thereof, a pyridoimidazoquinoxaline system compound and a derivative thereof, a benzophenoxazone system compound and a derivative thereof, a thioepindolidone system compound and a derivative thereof, an epindolidione system compound and a derivative thereof, a thioquinacridone system compound and a derivative thereof, a quinacridone system compound and a derivative thereof, a triphenodioxazine system compound and a derivative thereof, a perinone system compound and a derivative thereof, a Peckman dye system compound and a derivative thereof, a naphthyridine system compound and a derivative thereof, a benzofuropyrazine system compound and a derivative thereof, an azathioxantene system compound and a derivative thereof, and an azanaphthofluoranthene system compound and a derivative thereof.

The polymethine system compound, specifically, can include a methine system compound and a derivative thereof, a polymethine system compound and a derivative thereof, a merocyanine system compound and a derivative thereof, a hemicyanine system compound and a derivative thereof, a streptocyanine system compound and a derivative thereof, an oxanol system compound and a derivative thereof, a pyrylium system compound and a derivative thereof, and a cyanine system compound and a derivative thereof. More specifically, the polymethine system compound can include a phthalocyanine system compound and a derivative thereof, a subphthalocyanine system compound and a derivative thereof, and a dipyrine system compound and a derivative thereof.

The π conjugated low-molecular-weight system compound, specifically, can include a dicyanomethylene system compound and a derivative thereof, and a malenonitrile system compound and a derivative thereof. The carbonium system compound, specifically, can include a xanthen system compound and a derivative thereof, a rhodamine system compound and a derivative thereof, an acridine system compound and a derivative thereof, a thioxanthene system compound and a derivative thereof, and an acridone system compound and a derivative thereof. The styryl system compound, specifically, can include a monofunctional styryl system compound and a derivative thereof, a polyfunctional styryl system compound and a derivative thereof, and a tetrabuthylbutadiene system compound and a derivative thereof. The stilbene system compound, specifically, can include a stilbene system compound and a derivative thereof, an azomethine system compound and a derivative thereof, an azobenzene system compound and a derivative thereof, and a fluorossein system compound and a derivative thereof. The metal complex system compound, specifically, can include a Schiff base system compound and a derivative thereof, a porphyrin system compound ad a derivative thereof, a metalloporphyrin system compound and a derivative thereof, a metallodipyrine system compound and a derivative thereof, a lanthanoid system compound and a derivative thereof, a metallophthalocyanine system compound and a derivative thereof, and a hydroxyquinolilato complex system compound and a derivative thereof. More specifically, the metal complex system compound can include a tris(8-quinolinolato) metal complex represented by tris(8-quinolinolato) aluminum, and a derivative thereof. The π conjugated polymer system compound, for example, can include a PPV system compound and a derivative thereof, an oligothiophene system compound and a derivative thereof, a polythiophene system compound and a derivative thereof, and a polyalkylfluorene system compound and a derivative thereof. The σ conjugated system compound, specifically, can include an oligosilane system compound and a derivative thereof, and a polysilane system compound and a derivative thereof. In addition, the σ conjugated system compound can include, specifically, as other compounds, an indigo compound and a derivative thereof, a thioindigo compound and a derivative thereof, a spiran compound and a derivative thereof, a silane system compound and a derivative thereof, and a boron system compound and a derivative thereof.

In the image pickup element, etc. of the present disclosure, it is possible to adopt a constitution in which a first buffer layer/an organic photoelectric conversion layer/a second buffer are formed between the first electrode and the second electrode. Specifically, for example,
[First Constitution]
It is possible to adopt a constitution of:
a first buffer layer
an organic photoelectric conversion layer
    a p-type organic material of the present disclosure, or
    a mixed material of a p-type organic material of the present disclosure and an n-type organic transparent material, or
    a bulk-hetero layer
a second buffer layer. The respective layers may be a laminated structure of a plurality of material layers or a mixed layer of a plurality of materials as long as the layers have the respective desired functions. In some cases, the first buffer layer can be omitted. In addition, "the bulk-hetero layer" is a layer including a mixed layer of a p-type organic optical absorption material and an n-type organic optical absorption material. It should be noted that the first electrode may be located below and the second electrode may be located above, or the second electrode may be located below and the first electrode may be located above. In addition, the lamination order of the layers between the first electrode and the second electrode can also be vertically reversed. This applies to the following.

An n-type organic dye material or organic transparent material constituting the first buffer layer can include an aromatic ring system compound and a hydrazine system compound in addition to the n-type organic optical absorption material or organic transparent material described above. The aromatic ring system compound, specifically, can include a monoamine system compound and a derivative thereof, an alkylene bond system compound and a derivative thereof, an allylene system compound and a derivative thereof, a phenylenediamine system compound and a derivative thereof, and a star-burst system compound and a derivative thereof. In addition, other components, specifically, can include metals represented by Ca, Mg, Li, Ag, and Al, and inorganic compounds of these metals (specifically, halides, oxides and complex compounds of these metals).

The organic photoelectric conversion layer may include the following materials in addition to the p-type organic materials of the present disclosure. That is to say, the organic photoelectric conversion layer may include an aromatic ring system compound, a hydrozone system compound, an alicyclic system compound, an aromatic ring system compound, and a heterocyclic ring system compound. The aromatic ring system compound, specifically, can include a monoamine system compound and a derivative thereof, an alkylene bond system compound and a derivative thereof, an allylene system compound and a derivative thereof, a phenylenediamine system compound and a derivative thereof, and a star-burst system compound and a derivative thereof. The alicyclic system compound, specifically, can include a cyclopentadiene system compound and a derivative thereof. The aromatic ring system compound can include a tetraphenylbutadien system compound and a derivative thereof, a p-phenylene system compound and a derivative thereof, and a fluoronylidenemethane system compound and a derivative thereof. The heterocyclic ring system compound, specifically, can include a tiadiazopyridine system compound and a derivative thereof, a pyrrolopyridine system compound and a derivative thereof, a germacyclopentadiene system compound and a derivative thereof, a benzazole system compound and a derivative thereof, and a terryleneimido system compound and a derivative thereof. The n-type organic transparent material included in the organic photoelectric conversion layer can include the n-type organic optical absorption material or organic transparent material described above.

The p-type organic dye material or organic transparent material constituting the second buffer layer can include an alicyclic system compound, an aromatic ring system compound, and a heterocyclic system compound in addition to the p-type organic optical absorption material or organic transparent material described above. The alicyclic system compound, specifically, can include a cyclopentadiene system compound and a derivative thereof. The aromatic ring system compound can include a tetraphenylbutadien system compound and a derivative thereof, a p-phenylene system compound and a derivative thereof, and a fluoronylidenemethane system compound and a derivative thereof. The heterocyclic system compound, specifically, can include a tiadiazophridine system compound and a derivative thereof, a pyrrolopyridine system compound and a derivative thereof, a germacyclopentadiene system compound and a derivative thereof, a benzazole system compound and a derivative thereof, and a terryleneimido system compound and a derivative thereof.

Alternatively, in the image pickup element, etc. of the present disclosure, it is possible to adopt a form in which the first buffer layer/the n-type organic material layer/the organic photoelectric conversion layer/the p-type organic material layer/the second buffer layer are formed between the first electrode and the second electrode. Specifically, for example, it is possible to adopt such a constitution that:
[Second Constitution]
a first buffer layer
an n-type organic material layer
an organic photoelectric conversion layer
    a p-type organic material of the present disclosure, or
    a mixed material of the p-type organic material of the present disclosure and the n-type organic transparent material, or
    a bulk-hetero layer
a p-type organic material layer
a second buffer layer.
The layers may be a laminated structure of a plurality of material layers or a mixed layer of a plurality of materials as long as the layers have the respective desired functions.

It is only necessary that the first buffer layer, the organic photoelectric conversion layer, and the second buffer layer have the similar constitution to that of the first buffer layer, the organic photoelectric conversion layer, and the second buffer layer which are described in [First Structure].

The organic dye material or organic transparent material constituting the n-type organic material can include an aromatic ring system compound and a hydrazone system compound in addition to the n-type organic optical absorption material or organic transparent material described above. The aromatic ring system compound, specifically, can include a monoamine system compound and a derivative thereof, an alkylene bond system compound and a derivative thereof, an allylene system compound and a derivative thereof, a phenylenediamine system compound and a derivative thereof, and a star-burst system compound and a derivative thereof.

The organic dye material or organic transparent material constituting the p-type organic material layer can include the similar material to that of the second buffer layer described in [First Structure].

Alternatively, in the image pickup element, etc. of the present disclosure, it is possible to adopt a form in which a hole blocking layer/an organic photoelectric conversion layer/an electron blocking layer are formed between the first electrode and the second electrode. Specifically, for example, it is possible to adopt such a constitution that:
[Third Constitution]
a hole blocking layer
an organic photoelectric conversion layer
    a p-type organic material of the present disclosure, or
    a mixed material of the p-type organic material of the present disclosure and an n-type organic transparent material, or
    a bulk-hetero layer
an electron blocking layer.

The layers may be a laminated structure of a plurality of material layers or a mixed layer of a plurality of materials as long as the layers have the respective desired functions.

The p-type organic dye material or organic transparent material constituting the hole blocking layer can include the similar material to that of the second buffer layer described in [First Structure]. In addition, other compounds, specifically, can include metals represented by Ca, Mg, Li, Ag, and Al, and inorganic compounds of these metals (specifically, halides, oxides and complex compounds of these metals).

The n-type organic dye material or organic transparent material constituting the electron blocking layer can include the similar material to that of the first buffer layer described in [First Structure].

Alternatively, in the image pickup element, etc. of the present disclosure, it is possible to adopt either a form in which a laminated structure of an n-type first organic photoelectric conversion layer and a p-type second organic photoelectric conversion layer (including the p-type organic material of the present disclosure) is formed between the first electrode/the first buffer layer and the second buffer layer/the second electrode, or a form in which this laminated structure is repetitively formed. The materials constituting these layers can include the various kinds of materials described so far.

In addition, it is possible to adopt either a form in which a laminated structure of the n-type first organic photoelectric conversion layer, the bulk-hetero layer, and the p-type second organic photoelectric conversion layer (including the p-type organic material of the present disclosure) is formed between the first electrode/the first buffer layer and the second buffer layer/the second electrode, or a form in which this laminated structure is repetitively formed.

In addition, it is also possible to adopt the so-called tandem structure in which the image pickup element according to the first aspect and the second aspect of the present disclosure having a sensitivity to a red color, the image pickup element according to the first aspect and the second aspect of the present disclosure having a sensitivity to a green color, and the image pickup element according to the first aspect and the second aspect of the present disclosure having a sensitivity to a blue color are laminated on one another.

In the image pickup element, etc. of the present disclosure including the predetermined forms and constitutions described so far, it is possible to adopt a constitution in which:

the first electrode including the transparent conductive material is formed on a transparent substrate, the organic photoelectric conversion layer is formed on the first electrode, and the second electrode is formed on the organic photoelectric conversion layer. Alternatively, it is possible to adopt a constitution in which:

the first electrode is formed on a substrate, the organic photoelectric conversion layer is formed on the first electrode, and the second electrode including the transparent conductive material is formed on the organic photoelectric conversion layer. Here, although the first electrode and the second electrode are separated from each other, such a separation state can include a form in which the second electrode is formed above the first electrode.

A method of depositing the organic photoelectric conversion layer can include a paint-on method, a PVD method, and various CVD methods including an MOCVD method.

Here, the paint-on method, specifically, can exemplify a spin coating method; an immersion method; a casting method; various printing methods such as a screen printing method, an inkjet printing method, an offset printing method, and a gravure printing method; a stamping method, a spraying method; and various coating methods such as an air doctor coater method, a blade coaster method, a rod coater method, a knife coater method, a squeeze coater method, a reverse roll coater method, a transfer roll coater method, a gravure coater method, a kiss coater method, a cast coater method, a spraying coater method, a slit orifice coater method, and a calendar coater method. It should be noted that the paint-on method can exemplify an organic solvent having nonpolar or low polar such as toluene, chloroform, hexane or ethanol as a solvent, but the paint-on method is by no means limited thereto. In addition, the PVD method can include: various vacuum evaporation methods such as an electron beam heating method, a resistance heating method, and flash evaporation; a plasma evaporation method; various sputtering methods such as a diode sputtering method, a DC sputtering method, a DC magnetron sputtering method, a high-frequency sputtering method, a magnetron sputtering method, an ion beam sputtering method, and a bias sputtering method; and various ion plating methods such as a direct current (DC) method, an RF method, a multi-cathode method, an activation reaction method, an electric field vapor deposition method, a high-frequency ion plating method, and a reactive ion plating method. Alternatively, when the image pickup elements are integrated with one another in order to configure the solid-state image pickup device, it is also possible to adopt a method of forming a pattern based on a pulse laser deposition method (PLD method).

It is possible to exemplify that the thickness of the organic photoelectric conversion layer, not limited to, for example, is in the range of $1\times10^{-8}$ m to $7\times10^{-7}$ m, preferably in the range of $2.5\times10^{-8}$ m to $5\times10^{-7}$ m, more preferably in the range of $2.5\times10^{-8}$ m to $5\times10^{-7}$ m, and still more preferably in the range of $1\times10^{-7}$ m to $3\times10^{-7}$ m.

The substrate can include organic polymer (having a form of a polymer material such as a plastic film, a plastic sheet, or a plastic substrate having the flexibility and including a polymer material) exemplified by polymethylmethacrylate (polymethylmethacrylate, PMMA), polyvinyl alcohol (PVA), polyvinyl phenol (PVP), polyether sulfone (PES), polyimide, polycarbonate (PC), polyethylene-telephthalate (PET), and polyethylene-naphthalate (PEN), or can include mica. When the substrate including such a polymer material having the flexibility is used, for example, the incorporation or integration of the image pickup element, etc. in or with the electronic apparatus having a curved surface shape becomes possible. Alternatively, the substrate can include various glass substrates, various glass substrates on surfaces of which insulating films are formed, a quartz substrate, a quartz substrate on a surface of which an insulating film is formed, a silicon substrate, a silicon substrate on a surface of which an insulating film is formed, and metallic substrates including various alloys or various metals such as a stainless steel. It should be noted that the insulating film can include: a silicon oxide system material (such as $SiO_x$ or spin-on-glass (SOG)); a silicon nitride ($SiN_y$); a silicon oxynitride (SiON); an aluminum oxide ($Al_2O_3$); and a metal oxide or a metal salt. In addition, it is also possible to use conductive substrates (a substrate including a metal such as gold, or aluminum, or a substrate including highly oriented graphite) on the surfaces of which these insulating films are formed. Although the surface of the substrate is desirably smooth, it may have such roughness as not to exert a bad influence on the characteristics of the organic photoelectric conversion layer. A silanol derivative may be formed on the surface of the substrate by using a silane coupling method, a thin film including a thiol derivative, a carboxylic acid derivative, a phosphoric acid derivative or the like may be formed on the surface of the substrate by using a SAM method or the like, and a thin film including an insulating metal salt or metal complex may also be formed on the surface of the substrate by using the CVD method or the like, thereby enhancing the adhesiveness between the first electrode or the second electrode, and the substrate. The transparent substrate means a substrate including a material which does not excessively absorb the light made incident to the organic photoelectric conversion layer through the substrate.

In accordance with circumstances, the electrode and the organic photoelectric conversion layer may be covered with a covering layer. A material constituting the coating layer can include: not only an inorganic insulating material exemplified by a metal oxide high-dielectric insulating film such as a silicon oxide system material; a silicon nitride ($SiN_y$); and an aluminum oxide ($Al_2O_3$), but also an organic insulating material (organic polymer) exemplified by polymethylmethacrylate (PMMA); polyvinyl phenol (PVP); polyvinyl alcohol (PVA); polyimide; polycarbonate (PC); polyethylene-telephthalate (PET); polystyrene; a silanol derivative (silane coupling agent) such as N-2(aminoethyl) 3-aminopropyltrimethoxysilane (AEAPTMS), 3-mercaptoprophyltrimethoxysilane (MPTMS), or octadecyltrichlorosilane (OTS); and a straight chain hydrocarbon class having a functional group capable of being coupled to the electrode at one end of octadecanethiol, dodecylisocyanade or the like, and can also use a combination thereof. It should be noted that a silicon oxide system material can exemplify a silicon oxide ($SiO_x$), BPSG, PSG, BSG, AsSG, PbSG, a silicon oxynitride (SiON), SOG (spin-on-glass), and a low-dielectric material (such as polyaryl-ether, cycloperfluorocarbon polymer, benzocyclobutene, an annular fluorine resin, polytetrafluoroethylene, fluoroaryl-ether, fluorinated polyimide, amorphous carbon, or organic SOG).

The solid-state image pickup device can include a surface illumination type, or can include a back-illumination type. In addition, the solid-state image pickup device can constitute a single-plate type color solid-state image pickup device. In addition thereto, as may be necessary, the image pickup element may be provided with an on-chip microlens or a light blocking layer, and is provided with a drive circuit and wiring for driving the image pickup element. A shutter for controlling the incidence of the light to the image pickup element may be disposed as may be necessary, or in response to the purpose of the solid-state image pickup device, the image pickup device may include an optical cut filter. Moreover, when the image pickup elements in the image pickup device of the present disclosure is constituted by a single layer of the image pickup element of the present disclosure an array of the image pickup elements can include a Bayer array, an interline array, a G stripe RB checkered array, a G stripe RB full checkered array, a checkered complementary color array, a stripe array, an oblique stripe array, a primary color difference array, a field color difference sequential array, a frame color difference sequential array, a MOS type array, an improved MOS type array, a frame interleave array, and a field interleave array. It should be noted that the image pickup element, etc. of the present disclosure can constitute an optical sensor, an image sensor, and a solar cell in addition to the solid-state image pickup device such as a television camera.

Example 1

Example 1 relates an image pickup element according to a first aspect and a second aspect of the present disclosure, a photoelectric conversion element according to the first aspect and the second aspect of the present disclosure, and a solid-state image pickup device according to a first aspect of the present disclosure.

An image pickup element 11, and a photoelectric conversion element of Example 1, as depicted in a schematic cross-sectional view of FIG. 1 are an image pickup element 11, and a photoelectric conversion element in each of which at least a first electrode 21, an organic photoelectric conversion layer 30, and a second electrode 22 are laminated on one another in order. That is to say, the image pickup element 11, and the photoelectric conversion element are each provided with:

(a-1) the first electrode 21 and the second electrode 22 which are provided separately from each other; and (a-2) the organic photoelectric conversion layer 30 provided between the first electrode 21 and the second electrode 22. Then, the organic photoelectric conversion layer 30 includes a first organic semiconductor material having the structural formula (1) or structural formula (2) described above. In addition, the solid-state image pickup device of Example 1 is provided with a plurality of image pickup elements 11 of Example 1. Specifically, the solid-state image pickup device of Example 1 is provided with the image pickup elements of Example 1 which are arrayed in a two-dimensional matrix.

The first electrode 21 as the electrode on a light incidence side includes a transparent conductive material, specifically, an indium-tin oxide (ITO) having a thickness of 120 nm. In addition, the second electrode 22 includes aluminum (Al) having a thickness of 100 nm. The first electrode 21 including the transparent conductive material is formed on the transparent substrate 20, the organic photoelectric conversion layer 30 is formed on the first electrode 21, and the second electrode 21 is formed on the organic photoelectric conversion layer 30. In such a way, the second electrode 22 is provided above the second electrode 21. The light is made incident to the organic photoelectric conversion layer 30 through the substrate 20 and the first electrode 21. The substrate 20 includes a quartz substrate having a thickness of 0.7 mm. Surface roughness of the substrate 20 was $R_a$=0.28 nm, and $R_{max}$=3.3 nm.

The image pickup element 11 of Example 1 can be manufactured by the following method. That is to say, firstly, an ITO film having a thickness of 120 nm was deposited on the substrate 20 including a quartz substrate by using a sputtering system, and the first electrode 21 including the ITO film was obtained based on a photolithography technique and an etching technique. Next, an insulating layer 31 was formed on the substrate 20 and the first electrode 21. After the insulating layer 31 was subjected to the patterning based on the photolithography technique and the etching technique, thereby exposing the one-mm-square first electrode 21, ultrasonic cleaning was carried out by using a detergent, acetone, and ethanol. In addition, after the substrate was dried, an ultraviolet rays/ozone process was further carried out for 10 minutes. Next, the substrate 20 was fixed to a substrate holder or a vacuum evaporation system, and an evaporation chamber was decompressed to $5.5 \times 10^{-5}$ Pa.

After that, the organic photoelectric conversion layer 30 including a material having the structural formula (1) or the structural formula (2) (specifically, having the structural formula (2), 2,7-Bis(4-biphenyl)-[1]benzothieno[3,2-b][1]benzothiophene), and the organic photoelectric conversion layer 30 including fullerene (C60) were deposited on the first electrode 21. Specifically, the organic photoelectric conversion layer 30 was deposited at an evaporation rate of 1:1 by using the co-evaporation method to have a thickness of 100 nm. The organic photoelectric conversion layer 30 is constituted by a mixed layer (bulk-hetero layer) of the p-type organic material, in the present disclosure, having the structural formula (2), and fullerene (C60) as the n-type organic semiconductor.

Thereafter, the second electrode (cathode) 22 including ITO having a thickness of 100 nm was deposited by using the sputtering system, thereby obtaining an image pickup element for evaluation of Example 1 depicted in a schematically partial cross-sectional view of FIG. 1. It should be noted that because of the image pickup element for evaluation, the second electrode included ITO having a thickness of 100 nm.

For an image pickup element of Comparative Example 1, the organic photoelectric conversion layer 30 included a sub-phthalocyanine system derivative and fullerene (C60) instead of including the material having the structural formula (2) and fullerene (C60). Except for this point, the image pickup element of Comparative Example 1 has the same constitution and structure as those of the image pickup element of Example 1.

The image pickup element of Example 1 and the image pickup element of Comparative Example 1 which were obtained in such a way were irradiated with a given quantity of light (=1.64 µW/cm$^2$) having a wavelength of 450 nm and a wavelength of 560 nm corresponding to the respective local maximum optical absorption wavelengths through the substrate 20 and the first electrode 21. Then, in a state in which the second electrode 22 was grounded, a predetermined voltage (bias voltage) was applied to the first electrode 21. A current value obtained at this time exhibits a photo-generated current value. Values of external quantum efficiencies each exhibiting the sensitivity of the image pickup element which was obtained from J-V characteristics concerned are depicted in following TABLE 1. It should be noted that in TABLE 1, a relative value of the external quantum efficiency of the image pickup element of Example 1 is depicted when a value of the external quantum efficiency of the image pickup element of Comparative Example 1 is set as "1." From TABLE 1, it is understood that the external quantum efficiency of the image pickup element of Example 1 increases approximately 11 times as compared with the case of the image pickup element of Comparative Example 1.

Figure 3:
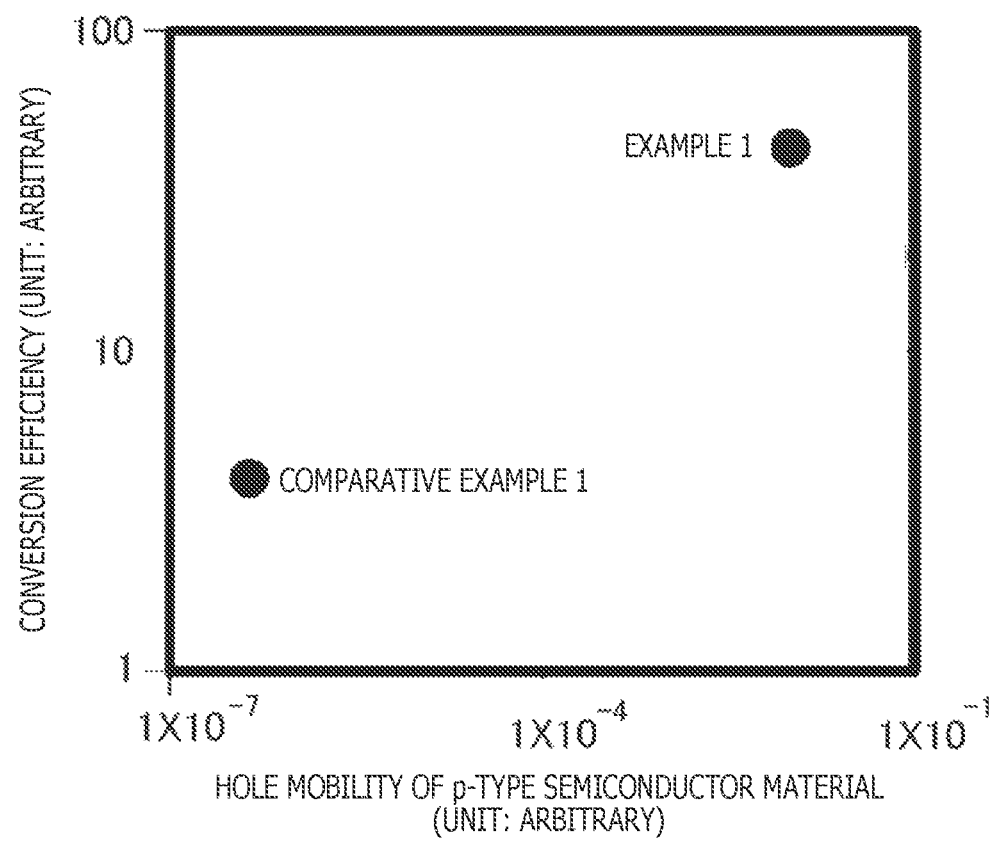
FIG. 3 is a graphical representation depicting a relationship between hole mobility and a conversion efficiency of a p-type semiconductor material constituting an organic photoelectric conversion layer in the image pickup element of Example 1 and Comparative Example 1.

Moreover, when none of the image pickup element of Example 1 and the image pickup element of Comparative Example 1 was irradiated with the light, in a state in which the second electrode 22 is grounded, the predetermined voltage (bias voltage) was applied to the first electrode 21, and thus a carrier (hole) mobility of the p-type semiconductor material constituting the organic photoelectric conversion layer 30 was measured. Although the resulting results are depicted in TABLE 1, it is understood that the hole mobility in the image pickup element of Example 1 extremely increases as compared with the case of the image pickup element of Comparative Example 1. FIG. 3 depicts a relationship between the hole mobility and the conversion efficiency of the p-type semiconductor material constituting each of the organic photoelectric conversion layers in the image pickup elements of Example 1 and Comparative Example 1.

TABLE 1

|  | External quantum efficiency | Hole mobility |
| --- | --- | --- |
| Example 1 | 10.8 | $1.0 \times 10^{-2}$ cm$^2$/V · s |
| Comparative Example 1 | 1.0 | $4.4 \times 10^{-7}$ cm$^2$/V · s |

Each of the organic photoelectric conversion layers in the image pickup elements of Example 1 and Comparative Example 1 uses fullerene as the n-type semiconductor material. In general, in the image pickup element constituted by the organic photoelectric conversion layer including the mixed layer (bulk-hetero layer) of the p-type semiconductor material and the n-type semiconductor material, the p-type semiconductor material plays the hole transfer, and the n-type semiconductor material plays the electron transfer, thereby generating the photocurrent. Then, as the carrier transfer property is higher, the external quantum efficiency also becomes high. Here, as depicted in FIG. 3, the hole mobility and the external quantum efficiency of the image pickup element of Example 1 are respectively higher than the hole mobility and the external quantum efficiency of the image pickup element of Comparative Example 1. This depicts that the structural formula (2) has the higher hole transfer property than that of the sub-phthalocyanine system derivative, and for this reason, the high external quantum efficiency can be attained. In a word, the organic photoelectric conversion layer is constituted by the mixed layer (bulk-hetero layer) of the material of the structural formula (2), and fullerene, thereby enabling the image pickup element and the photoelectric conversion element each having the high sensitivity and the high carrier transfer property to be presented.

Figure 2:
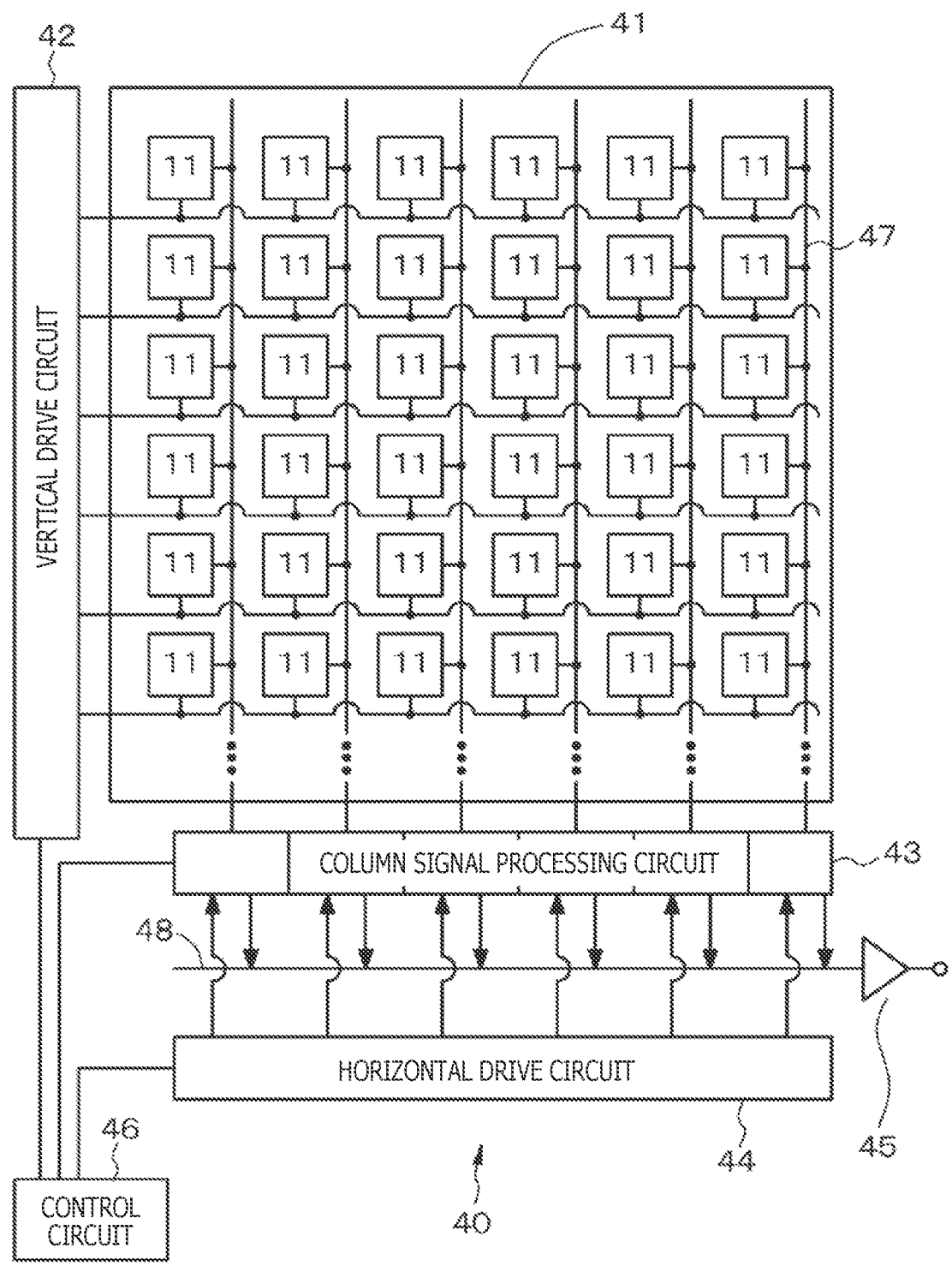
FIG. 2 is a conceptual diagram of a solid-state image pickup device of Example 1.

FIG. 2 depicts a conceptual diagram of a solid-state image pickup device of Example 1. A solid-state image pickup device 40 of Example 1 is constituted by an image pickup region 41, and a vertical drive circuit 42, a column signal processing circuit 43, a horizontal drive circuit 44, an output circuit 45, a control circuit 46, and the like which are peripheral circuits of the image pickup region 41. In this case, in the image pickup region 41, the image pickup elements 11 described above are arranged in a two-dimensional array on a semiconductor substrate (for example, a silicon semiconductor substrate). Incidentally, it goes without saying that these circuits can be configured with the well-known circuits, and can also be configured by using other circuit configurations (for example, the various circuits used in the past CCD image pickup apparatus or CMOS image pickup apparatus).

The control circuit 46 generates a lock signal and a control signal which become a reference of operations of the vertical drive circuit 42, the column signal processing circuit 43, and the horizontal drive circuit 44 based on a vertical synchronous signal, a horizontal synchronous signal, and a master clock. In addition, the clock signal and control signal thus generated are inputted to the vertical drive circuit 42, the column signal processing circuit 43, and the horizontal drive circuit 44.

The vertical drive circuit 42, for example, is configured by a shift register, and selectively scans the respective image pickup elements 11 of the image pickup region 41 successively in a vertical direction in units of a raw. In addition, pixel signals based on currents (signals) which are generated in response to quantities of received light in the respective image pickup elements 11 are sent to the column signal processing circuit 43 through vertical signal lines 47.

The column signal processing circuit 43, for example, is arranged every column of the image pickup elements 11 and carries out the signal processing for the noise removal and the signal amplification for the signals outputted from the image pickup elements 11 for one raw by the signal from a black reference pixel (formed in a circumference of an effective pixel area although not depicted) every image pickup element. In an output stage of the column signal processing circuit 43, a horizontal selection switch (not depicted) is connected and provided between itself and the horizontal signal line 48.

The horizontal drive circuit 44, for example, is configured by a shift register. The horizontal drive circuit 44 successively selects each of the column signal processing circuits 43 by successively outputting horizontal scanning pulses, and outputs the signals from each of the column signal processing circuits 43 to the horizontal signal line 48.

The output circuit 45 executes signal processing for the signals which are successively supplied thereto through the horizontal signal line 48 from each of the column signal processing circuits 43, and outputs the resulting signals.

Here, since the organic photoelectric conversion layer itself functions as the color filter as well, the color separation can be carried out even when no color filter is arranged.

In the image pickup element or the photoelectric conversion element of Example 1, the material of the structural formula (1) or the structural formula (2) having the high hole mobility is used in the organic photoelectric conversion layer, thereby enabling the photoelectric conversion efficiency and the hole mobility to be greatly enhanced. In addition, the material of the structural formula (1) or the structural formula (2) has the high carrier transport ability, the thickness of the organic photoelectric conversion layer can be adjusted. Thus, the problems of the high resistance, the low mobility, and the low carrier density as the disadvantages which the past organic material has can be solved, and the image pickup element, the photoelectric conversion element, and the solid-state image pickup device each having the high sensitivity, the high S/N ratio, and the high drive speed can be presented. Moreover, the thickness of the organic photoelectric conversion layer is adjusted, thereby enabling the spectral characteristics of the image pickup element in the solid-state image pickup device to be adjusted. In addition, fullerene or the fullerene derivative is contained in the material of the structural formula (1) or the structural formula (2), and/or the p-type organic optical absorption material or organic transparent material and/or the n-type organic optical absorption material or organic transparent material is contained in the material of the structural formula (1) or the structural formula (2), thereby resulting in that the thickness and the spectral characteristics of the organic photoelectric conversion layer can be controlled with a high degree of freedom, and the higher performance of the solid-state image pickup device can be promoted.

Example 2

Example 2 is a modified change of Example 1. In an image pickup element or a photoelectric conversion element of Example 2,
the organic photoelectric conversion layer further includes a second organic semiconductor material and a third organic semiconductor material,
the second organic semiconductor material includes fullerene or a fullerene derivative, and a value $\mu_3$ of a line absorption coefficient in a local maximum optical absorption wavelength of a visible light region of the third organic semiconductor material is larger than a value $\mu_1$ of a line absorption coefficient in a local maximum optical absorption wavelength of a visible light region of the first organic semiconductor material, and is larger than a value $\mu_2$ of a line absorption coefficient in a local maximum optical absorption wavelength of a visible light region of the second organic semiconductor material.

Specifically, in Example 2A, organic semiconductor materials depicted in following TABLE 3 were used. It should be noted that the third organic semiconductor material includes a sub-phthalocyanine system derivative. A thickness of the organic photoelectric conversion layer is 250 nm.

On the other hand, in Comparative Example 2A, a quinacridone derivative-A, a quinacridone derivative-B, and the same sub-phthalocyanine system derivative as that used in Example 2A were used as the organic semiconductor material constituting the organic photoelectric conversion layer. It should be noted that a thickness of the organic photoelectric conversion layer is 180 nm.

The pieces of hole mobility of the first organic semiconductor material, the quinacridone derivative-A, a quinacridone derivative-B, and quinacridone are as depicted in following TABLE 2.

TABLE 2

| | Hole mobility |
|---|---|
| First organic semiconductor material | $1.0 \times 10^{-2}$ cm$^2$/V · s |
| Quinacridone derivative-A | $8.1 \times 10^{-8}$ cm$^2$/V · s |
| Quinacridone derivative-B | $1.1 \times 10^{-10}$ cm$^2$/V · s |
| Quinacridone | $3.0 \times 10^{-6}$ cm$^2$/V · s |

TABLE 3 organic semiconductor materials each constituting organic photoelectric conversion layer

| | |
|---|---|
| First organic semiconductor | Material having structural formula (2) ($\mu_1 = 0$ cm$^{-1}$, no absorption of green color region) |
| Second organic semiconductor | Fullerene (C60) material ($\mu_2 = 0$ cm$^{-1}$, no absorption of green color region) |
| Third organic semiconductor | Subphthalocyanine system material derivative ($\mu_3 = 2.6 \times 10^5$ cm$^{-1}$) |

Figure 4:
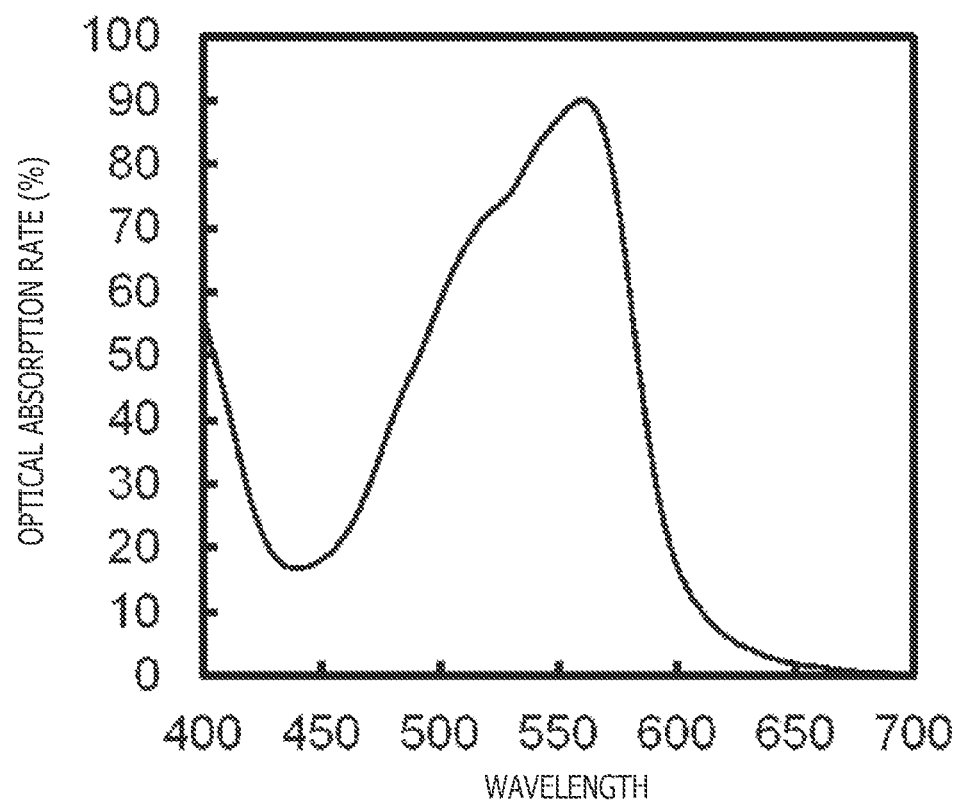
FIG. 4 is a graphical representation depicting spectral characteristics of an organic photoelectric conversion layer in an image pickup element of Example 2A.

In addition, as depicted in FIG. 4, the organic photoelectric conversion layer has a local maximum optical absorption wavelength in the range of 450 nm or more to 650 nm or less.

Measurement results of external quantum efficiencies and dark currents of Example 2A and Comparative Example 2A are depicted in following TABLE 4. It should be noted that TABLE 4 depicts relative values of the external quantum efficiency and the dark current of the image pickup element of Example 2A when values of the external quantum efficiency and the dark current of the image pickup element of Comparative Example 2A are set as "1."

TABLE 4

| | External quantum efficiency | Dark current |
|---|---|---|
| Example 2A | 2.25 | 0.58 |
| Comparative Example 2A | 1.00 | 1.0 |

From TABLE 4, it is understood that the image pickup element of Example 2A exhibits the high external quantum efficiency, and the low dark current as compared with the case of the image pickup element of Comparative Example 2A.

Then, in the image pickup element or the photoelectric conversion element of Example 2, the excitons generated by the optical absorption of the third organic semiconductor material are subjected to the exciton separation in both the interfaces of the organic semiconductor materials selected from two of the first organic semiconductor material, the second organic semiconductor material, and the third organic semiconductor material. Alternatively, the excitons generated by the optical absorption of the third organic semiconductor material are subjected to the exciton separation in the interface of one kind of organic semiconductor material selected from the first organic semiconductor material, the second organic semiconductor material, and the third organic semiconductor material. Specifically, the excitons generated by the optical absorption of the third organic semiconductor material are subjected to the exciton separation in the interface between the first organic semiconductor material and the third organic semiconductor material. It should be noted that such exciton separation can be detected based on a method such as a transient absorption spectrometry and a fluorescent lifetime measurement method.

Figure 5A:
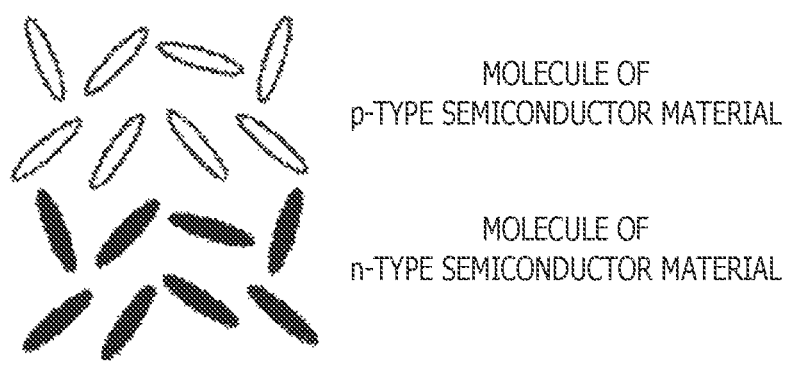
FIG. 5A is a conceptual view of a p/n junction surface as a boundary between a p-type semiconductor material and an n-type semiconductor material.

Now, the sensitivity of the solid-state image pickup device is largely influenced by the efficiency of the exciton charge separation (exciton charge separation rate) in the bulk-hetero structure. The light made incident to the organic photoelectric conversion layer excites the electrons in the organic molecules constituting the organic photoelectric conversion layer to produce the single excitons. When the single excitons diffuse to reach a boundary between the p-type semiconductor material and the n-type semiconductor material, that is, a p/n junction surface (a conceptual view is depicted in FIG. 5A), the single excitons are charge-separated into the holes and the electrons by an internal electric field generated in the p/n junction surface. For enhancing the sensitivity of the solid-state image pickup device, it is important that the exciton charge separation rate is enhanced to increase the photoelectric conversion efficiency. In general, the single excitons of the organic molecules are deactivated for 1 nanosecond to 1 microsecond to return back to the ground state. Therefore, for increasing the photoelectric conversion efficiency, it is preferable that the exciton charge separation is carried out for a time period sufficiently shorter than the exciton life, for example, 0.1 nanoseconds or less. From this fact, the exciton charge separation rate in the p/n junction surface is preferably $1 \times 10^{10}$ s$^{-1}$ or more.

Figure 5B:
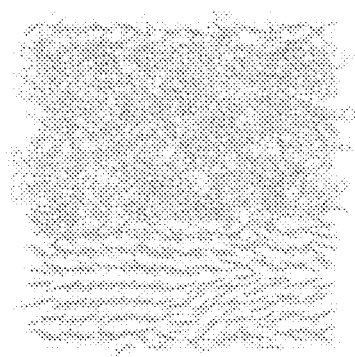
FIG. 5B is a schematic view depicting a p/n junction surface structure of 6×6×6 nm³ manufactured by a molecular dynamics method.
Figure 5C:
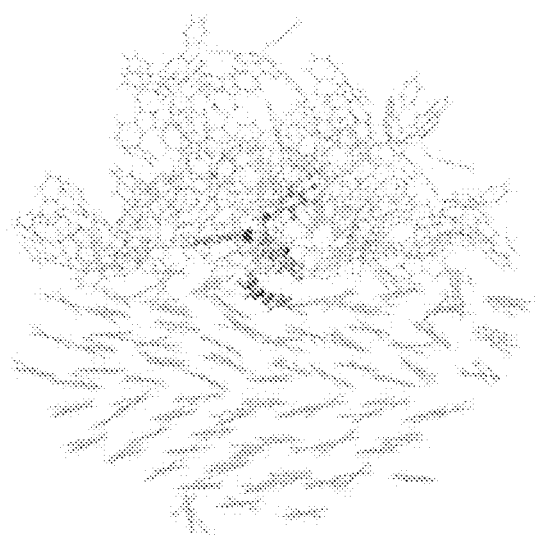
FIG. 5C is a schematic view in which a dimer of 2,7-Diphenyl-[1]benzothieno[3,2-b][1]benzothiophene (DPh-BTBT) and F6SubPc-OC6F5 is selected from which an exciton charge separation rate is described to be obtained, and a molecule having the center of gravity in a radius of 2.5 nm from the center of gravity of DPh-BTBT is taken out, the molecule depicted in the form of ball-and-stick display being the dimer from which the exciton charge separation rate is desired to be obtained, and the molecule depicted in the form of line display being a peripheral molecule.

The exciton charge separation rate was calculated by the theoretical simulation. Firstly, for example, diphenylbenzothienobenzothiophene (2,7-Diphenyl[1]benzothieno[3,2-b][1]benzothiophene, DPh-BTBT) as a derivative of benzothienobenzothiophene, and, for example, F6SubPc-OC6F5 [refer to the structural formula (18)] as a derivative of sub-phthalocyanine are used. Here, DPh-BTBT relatively functions as the p-type semiconductor material, and F6SubPc-OC6F5 relatively functions as the p-type semiconductor material. Then, a p/n junction surface structure of 6×6×6 nm$^3$ depicted in FIG. 5B was manufactured by using a molecular dynamics method. DPh-BTBT has a molecular structure in which the phenyl group is removed away one by one from the side chain of the both sides of the first organic semiconductor material depicted by the structural formula (2) and has the same main skeleton as that of the first organic semiconductor material. In general, since the exciton separation of the organic semiconductor material is generated between the main skeletons, the evaluation for other organic semiconductor material having the same main skeleton as that of a certain organic semiconductor material can be carried out based on the result of simulation for the certain organic semiconductor material (for example, refer to T. Liu et al., J. Phy. Chem. C 115, 2406 (2011)). Therefore, the result of the simulation for DPh-BTBT is effective in evaluating the first organic semiconductor material depicted by the structural formula (2). Subsequently, a dimer of DPh-BTBT and F6SubPc-OC6F5 in which the exciton charge separation rate was desired to be obtained was selected from the structure depicted in FIG. 5B to take out the molecules each having the center of gravity within a radius of 2.5 nm from the center of gravity of DPh-BTBT. FIG. 5C depicts the structure thus taken out. The molecule which is ball-and-stick displayed is the dimer in which the exciton charge separation rate is desired to be obtained, and the molecule which is line-displayed is the peripheral molecule. The exciton state calculation was carried out with respect to the structure of FIG. 5C. In the exciton state calculation, there was used a QM/MM method in which the dimer in which the exciton charge separation rate was desired to be obtained was calculated with the quantum mechanics, and the periphery molecule was calculated with the molecular mechanics. The exciton charge separation rate which was desired to be obtained in the dimer was obtained based on a Marcus theory (refer to R. A. Marcus, Rev. Mod. Phys. 65, 599 (1993)). In the Marcus theory, the exciton charge separation rate (charge-transfer rate) $\omega_{ab}$ between an initial state (state a) and a final state (state b) is expressed by following Expression (A).

$$\omega_{ab} = (H_{ab}^2/\pi)\{n/(\pi \cdot k_B T)\}^{1/2} \cdot \exp[-(\Delta G + \lambda)^2/(4\lambda k_B T)] \quad (A)$$

Here,
$H_{ab}$: transfer integration between two states (charge transfer integration)
h: reduced Plank constant (Dirac constant)
λ: relocation energy
$k_B$: Boltzmann's constant
T: absolute temperature
ΔG: Gibbs' free energy difference between two states.

ΔG and λ between the respective excited states are calculated as follows. Firstly, a single excited state is obtained from a first excited singlet state $s_1$ to tenth excited singlet state $s_{10}$, and the structural optimization is carried out with respect to the respective excited states to obtain an energy stable structure. Subsequently, a viburational calculation is carried out for the energy stable structures of the respective excited states to calculate the free energy. As a result, ΔG and λ between the respective excited states are calculated. $H_{ab}$ is calculated by using a generalized-Mulliken-Hush method (refer to R. J. Cave et al., J. Chem. Phys. 106, 9213 (1997)). The exciton charge separation rate in the p/n junction surface between DPh-BTBT and F6SubPc-OC6F5 was obtained with respect to the excitons generated within F6SubPc-OC6F5. TABLE 5 lists the exciton charge separation rates calculated by using Expression (A).

TABLE 5

| excition charge separation rate [unit: s$^{-1}$] | | |
|---|---|---|
| F6SubPc-OC6F5 exciton state | Charge separation state | Exciton charge separation rate |
| S$_1$ | S$_3$ | 2.6 × 10$^{12}$ |
| S$_1$ | S$_4$ | 2.7 × 10$^{10}$ |
| S$_1$ | S$_5$ | 2.3 × 10$^{10}$ |
| S$_2$ | S$_3$ | 2.7 × 10$^{12}$ |
| S$_2$ | S$_4$ | 5.4 × 10$^{11}$ |
| S$_2$ | S$_5$ | 7.9 × 10$^{11}$ |

From the above results, it was understood that the high exciton charge separation rate of 1×10$^{10}$ s$^{-1}$ or more was obtained in the p/n junction surface between DPh-BTBT and F6-SubPc-OC6F5. That is to say, it is understood that the excellent photoelectric conversion efficiency was obtained in the image pickup element (photoelectric conversion element) provided with the organic photoelectric conversion layer in which the p/n junction surface having the high exciton charge separation rate of 1×10$^{10}$ s$^{-1}$ or more.

Alternatively, the organic photoelectric conversion layer further includes a fourth organic semiconductor material. The fourth organic semiconductor material may be provided with a mother skeleton similar to that of the first organic semiconductor material, or may have the same mother skeleton as that of either the second organic semiconductor material or the third organic semiconductor material, and may be provided with a substituent different therefrom. Specifically, the fourth organic semiconductor material has the same mother skeleton (specifically, a sub-phthalocyanine system derivative) as that of the third organic semiconductor material, and is provided with the different substitutent. More specifically, the fourth organic semiconductor material includes the sub-phthalocyanine system derivative F6SubPc-F [refer to the structural formula (17)]. In such a way, the organic photoelectric conversion layer includes the fourth organic semiconductor material, thereby enabling the excellent spectral characteristics to be obtained. Alternatively, the fourth organic semiconductor material has the mother skeleton (specifically, benzothienobenzothiophene) similar to that of the first organic semiconductor material. More specifically, the fourth organic semiconductor material includes DPh-BTBT. That is to say, the organic photoelectric conversion layer includes the fourth organic semiconductor material, thereby enabling the excellent hole transport property to be obtained.

The enhancement of the carrier mobility is essential to the promotion of the enhancement of the operation frequency of the image pickup element, the reduction of the residual image in the image pickup element, the enhancement element of the photoelectric conversion efficiency of the image pickup element (photoelectric conversion element). In the image pickup element (photoelectric conversion element) of Example 2a, as described above, the organic photoelectric conversion layer further contains the second organic semiconductor material and the third organic semiconductor material. Then, an area (overlap area) of a portion in which the energy distribution state density of HOMO or LUMO of the second organic semiconductor material, and the energy distribution state density of HOMO or LUMO of the third organic semiconductor material overlap each other is 0.15 meV or more. Moreover, the energy distribution σ of the third organic semiconductor material or the energy distribution σ of the second organic semiconductor material is 70 meV or less. Here, the second organic semiconductor material includes either fullerene or the fullerene derivative, and the third organic semiconductor material includes the sub-phthalocyanine system derivative.

Specifically, the stable structure is built by carrying out the simulation based on the molecular dynamics method (MD method) (Step 1). Then, the adjacent molecule pair is drawn from this structure and a transfer integrated value ($J_{ij}$) is calculated by carrying out the first principle calculation. In addition, an HOMO energy and an LUMO energy (site energy $E_i$) in each of which the effect of the adjacent molecules is taken into consideration are calculated (Step 2). Next, the charge transfer rate ($\omega_{ij}$) is calculated based on Expression (A) described above by using a Marcus theory from the resulting transfer integrated value ($J_{ij}$ and side energy $E_i$). Then, a dynamic behavior of the carrier is simulated from a dynamic Moute Carlo method (kMC method) by using the resulting tranafer rate ($\omega_{ij}$) (Step 3). Then, the mobility μ is calculated by using the following Einstein relation from the resulting mean square displacement (MSD) of the carrier. Here, the energy distribution of the molecules is obtained from the site energy calculated in Step 2. Then, when the energy distributions of the two molecules are each obtained, an overlap area can be obtained from the overlap of the distributions.

$$\mu=(q/kBT)\cdot D$$

Figure 6:
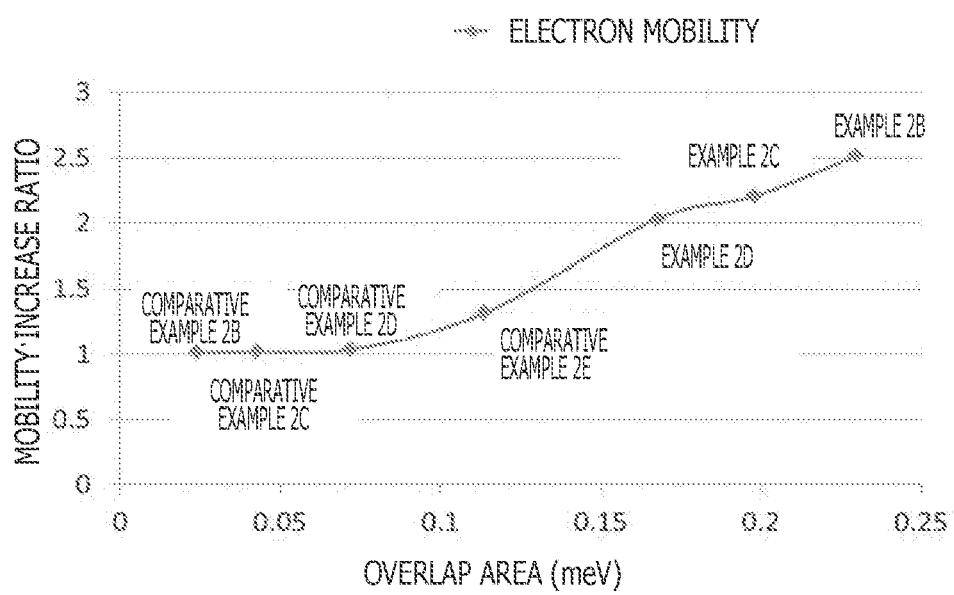
FIG. 6 is a graphical representation depicting a relationship between an overlap area of energy distributions of LUMO and carrier mobility which is obtained based on various second organic semiconductor materials and third organic semiconductor materials.
Figure 7:
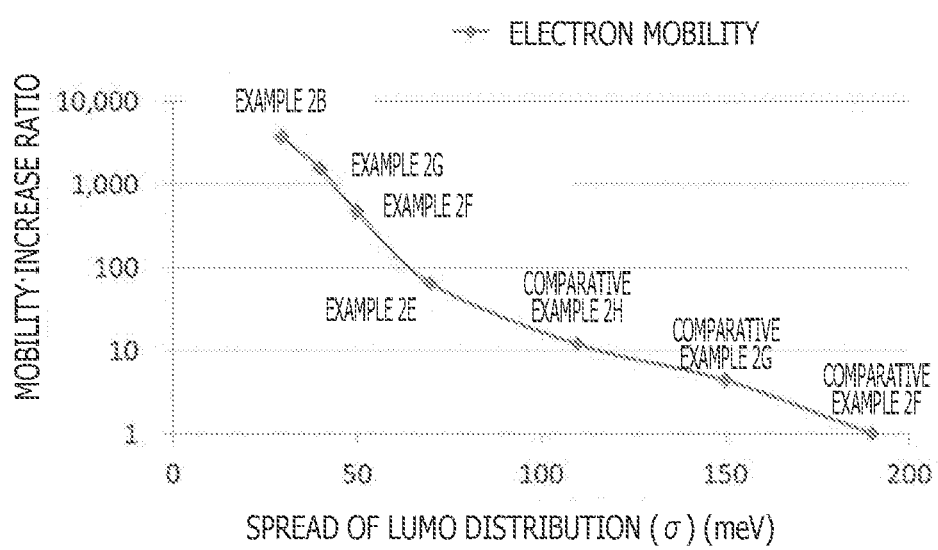
FIG. 7 is a graphical representation depicting a relationship between a value of the energy distribution σ of LUMO of the third organic semiconductor material, and carrier mobility.

Here,
q: electric charge
$k_B$: Boltzmann's constant
T: absolute temperature
D: diffusion coefficient The overlap area of the energy distributions of LUMO which was obtained based on the various second organic semiconductor material and third organic semiconductor material, and the energy distribution σ of the third organic semiconductor material are depicted in following TABLE 6. In addition, the states of overlap of the energy distributions of LUMO which were obtained based on the second organic semiconductor material and the third organic semiconductor material are depicted in FIG. 8 (Example 2B and Example 2C), FIG. 9 (Example 2D and Example 2E), FIG. 10 (Example 2F and Example 2G), FIG. 11 (Comparative Example 2B and Comparative Example 2C), FIG. 12 (Comparative Example 2D and Comparative Example 2E), FIG. 13 (Comparative Example 2F and Comparative Example 2G), and FIG. 14 (Comparative Example 2H and Comparative Example 2I). In these drawings, however, a unit of an abscissa axis is meV and an ordinate axis represents the energy of LUMO. It should be noted that in FIG. 8 to FIG. 14, "A" is data on C60, "B" is data on F6SubPc-OC5F6, the abscissa axis is the energy (unit: meV), and the ordinate axis is the probability density (unit: arbitrary). In addition, Example 2B, Example 2C, Example 2D, Example 2E, Example 2F, Comparative Example 2B, Comparative Example 2C, Comparative Example 2D, Comparative Example 2E, Comparative Example 2F, and Comparative Example 2G are examples in which the materials are used in which an average value shift amount of energy distribution σ of C60 or the energy distributions of F6SubPc-OC6F5 is virtually changed on the simulation. Moreover, a relationship between the overlap area of the energy distributions of LUMO, and the relative value of the carrier mobility is depicted in the graph of FIG. 6. A relationship between the value of the energy distribution σ of LUMO of the second organic semiconductor material, and the carrier mobility is depicted in the graph of FIG. 7. From FIG. 6, it is understood that an increase in overlap area results in that the relative value of the carrier mobility increases. In addition, it is also understood that as the value of the energy distribution σ of LUMO of the second organic semiconductor material is smaller, the carrier mobility becomes high. Here, when the carrier mobility becomes $10^{-4}$ cm$^2$/V·s or more, for example, the residual image characteristics are improved in the solid-state image pickup device, and thus the high-speed continuous photographing becomes possible which cannot be perceived by the eyes of the human being. Therefore, from the results described above, it is understood that when the area (overlap area) of the portion in which the energy distribution state density of LUMO of the second organic semiconductor material, and the energy distribution state density of LUMO of the third organic semiconductor material overlap each other is 0.15 meV or more, and when the energy distribution σ of the third organic semiconductor material or the energy distribution σ of the second organic semiconductor material is 70 meV or less, the high carrier mobility can be attained.

TABLE 6

|  |  | Energy distribution (σ) meV |  | Energy distribution (σ) meV | Average value shift amount meV | Overlap area meV |
| --- | --- | --- | --- | --- | --- | --- |
| Ex. 2B | C60 | 29.5 | F6-SubPc-OC6F5 | 131.8 | — | 0.230 |
| Ex. 2C | C60 | 29.5 | F6-SubPc-OC6F5 (Δμ = +20) | 131.8 | +20.0 | 0.198 |
| Ex. 2D | C60 | 29.5 | F6-SubPc-OC6F5 (Δμ = +40) | 131.8 | +40.0 | 0.168 |
| Ex. 2E | C60 (σ = 70) | 70.0 | F6-SubPc-OC6F5 | 131.8 | — | 0.425 |
| Ex. 2F | C60 (σ = 50) | 50.0 | F6-SubPc-OC6F5 | 131.8 | — | 0.342 |
| Ex. 2G | C60 (σ = 40) | 40.0 | F6-SubPc-OC6F5 | 131.8 | — | 0.291 |
| Comp. Ex. 2B | C60 | 29.5 | F6-SubPc-OC6F5 (Δμ = +200) | 131.8 | +200.0 | 0.0238 |
| Comp. Ex. 2C | C60 | 29.5 | F6-SubPc-OC6F5 (Δμ = +160) | 131.8 | +160.0 | 0.0427 |
| Comp. Ex. 2D | C60 | 29.5 | F6-SubPc-OC6F5 (Δμ = +120) | 131.8 | +120.0 | 0.0720 |
| Comp. Ex. 2E | C60 | 29.5 | F6-SubPc-OC6F5 (Δμ = +80) | 131.8 | +80.0 | 0.114 |
| Comp. Ex. 2F | C60 (σ = 190) | 190.0 | F6-SubPc-OC6F5 | 131.8 | — | 0.620 |
| Comp. Ex. 2G | C60 (σ = 150) | 150.0 | F6-SubPc-OC6F5 | 131.8 | — | 0.595 |
| Comp. Ex. 2H | C60 (σ = 110) | 110.0 | F6-SubPc-OC6F5 | 131.8 | — | 0.534 |
| Comp. Ex. 2I |  |  | F6-SubPc-OC6F5 | 131.8 | — |  |

Example 3

Figure 15A:
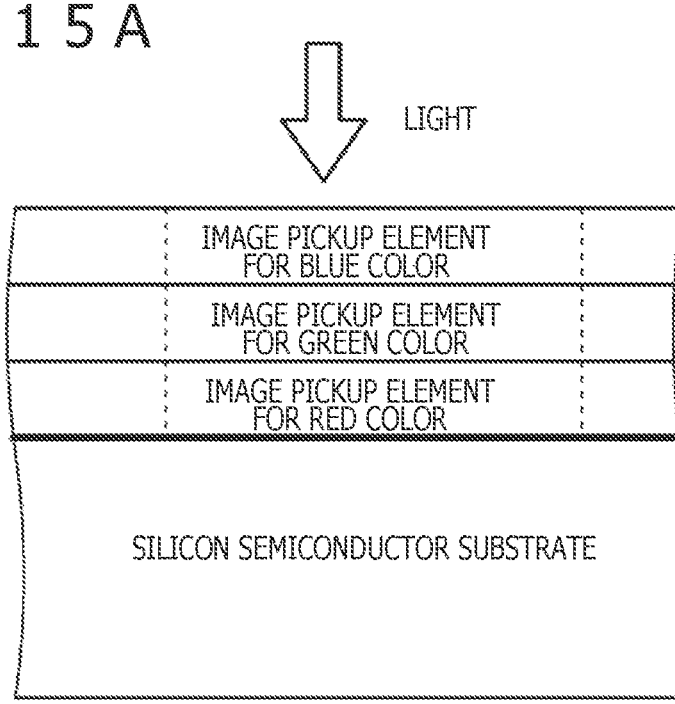
FIG. 15A and FIG. 15B are conceptual views of laminated image pickup element of Example 3.

Although Example 3 is a modified change of the image pickup element of Example 1 and Example 2, Example 3 relates to the laminated image pickup element of the present disclosure, and the solid-state image pickup device according to a second aspect of the present disclosure. That is to say, in the laminated image pickup element (image pickup element of longitudinal spectroscopic system) of Example 3, at least the two image pickup elements described in Example 1 and Example 2 are laminated on each other. In addition, the solid-state image pickup device of Example 3 is provided with a plurality of such laminated image pickup elements. Specifically, the laminated image pickup element of Example 3, as depicted in a conceptual view of FIG. 15A, has a structure in which the three image pickup elements (three sub-pixels): the image pickup element for a blue color; the image pickup element for a green color; and the image pickup element for a red color which are described in Example 1 and Example 2 are laminated on one another in the vertical direction. That is to say, it is possible to obtain the laminated image pickup element having the structure in which the sub-pixels are laminated on one another to be made one pixel. The image pickup element for a blue color is located in the uppermost layer, the image pickup element for a green color is located in the intermediate layer, and the image pickup element for a red color is located in the lowermost layer. However, the order of the lamination is by no means limited to that order.

Figure 15B:
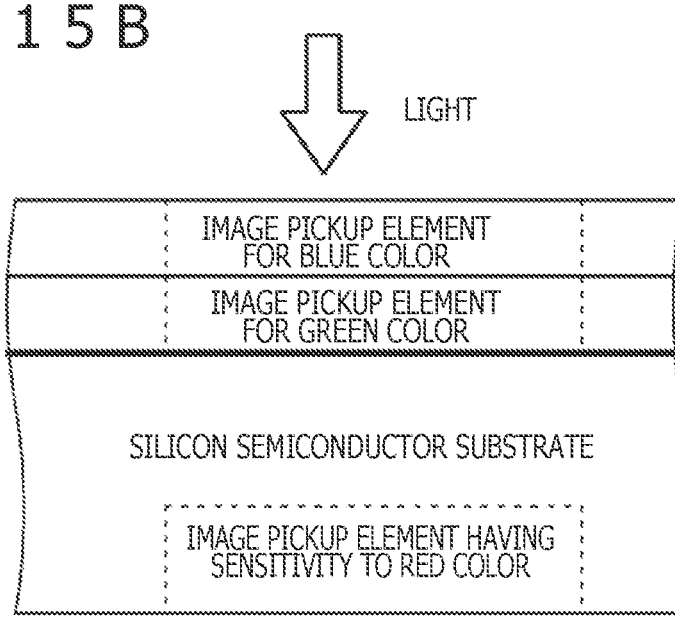

Alternatively, as depicted in a conceptual view of FIG. 15B, the image pickup elements (in a depicted example, the image pickup element for a blue color and the image pickup element for a green color) each described in Example 1 and Example 2 are provided on the silicon semiconductor substrate and one or a plurality of photoelectric conversion areas (the image pickup elements, and in the depicted Example, the image pickup element having the sensitivity to the red color) is provided in the inside of the silicon semiconductor substrate located below such image pickup elements. As a result, it is possible to obtain the laminated image pickup element having the structure in which the image pickup elements are laminated on one another, that is, the structure in which the sub-pixels are laminated on one another to be made one pixel.

Alternatively, the image pickup elements (for example, the image pickup element for a blue color or the image pickup element for a green color) described in Example 1 and Example 2 is provided on the silicon semiconductor substrate, and one or a plurality of photoelectric conversion regions (image pickup elements) is provided in the inside of the silicon semiconductor substrate located below such image pickup elements. As a result, it is possible to obtain the laminated image pickup element having the structure in which the image pickup elements are laminated on one another, that is, the structure in which the sub-pixels are laminated on one another to be made one pixel. Alternatively, the image pickup elements (for example, three kinds of image pickup elements: the image pickup element for a blue color; the image pickup element for a green color; and the image pickup element for a red color) described in Example 1 and Example 2 are provided on the silicon semiconductor substrate, and the photoelectric conversion region (image pickup element) having the sensitivity to the infrared ray is provided in the inside of the silicon semiconductor substrate located below each of these image pickup elements. As a result, it is also possible to obtain the laminated image pickup element having the structure in which the image pickup elements are laminated on one another, that is, for example, having one pixel including three kinds of sub-pixels. That is to say, each of these laminated image pickup elements is configured to have at least one first image pickup element (one first image pickup element, or a plurality of image pickup elements or laminated first image pickup elements) provided on(in) the semiconductor substrate (specifically, the silicon semiconductor substrate or the compound semiconductor substrate), and a second image pickup element provided above the first image pickup element(s). The second image pickup element is composed of the image pickup element according to the first aspect and the second aspect of the present disclosure.

Although the photoelectric conversion region (image pickup element) formed on(in) the silicon semiconductor substrate is preferably of a backside illumination type, instead thereof, a surface illumination type can also be adopted. Instead of providing the photoelectric conversion region in the inside of the silicon semiconductor substrate, the photoelectric conversion region can also be formed on the semiconductor substrate by using an epitaxial growth method, or can also be formed on(in) a silicon layer in the so-called SOI structure.

In the laminated image pickup element of Example 3, for the purpose of prevented the light reception of the image pickup element located below from being disturbed, in the image pickup element located above, the first electrode, for example, includes the transparent conductive material such as ITO, and the second electrode, for example, also includes the transparent conductive material such as ITO. This can also apply to the photoelectric conversion element.

In the solid-state image pickup device of Example 3 provided with the laminated image pickup elements, the spectrum of the blue color, the green color, and the red color is not carried out by using the color filters, but the image pickup elements having the sensitivities to the light having a plurality of kinds of wavelengths are laminated on one another in the direction of incidence of the light within the same pixels. Therefore, it is possible to enhance the improvement in the sensitivity, and the improvement in the pixel density per unit volume. In addition, since the organic material has the high absorption coefficient, the thickness of the organic photoelectric conversion layer can be more thinned than that of the past Si system photoelectric conversion layer. As a result, it is possible to relax the light leakage from the adjacent pixel(s), and the limitation of an incidence angle of the light. Moreover, in the past Si system image pickup element, the false color occurs because the color signals are produced by executing the interpolation processing among the pixels corresponding to the respective three colors. However, in the solid-state image pickup device of Example 3 provided with the laminated image pickup elements, the occurrence of the false color is suppressed.

Although the present disclosure has been described so far based on preferred Examples, the present disclosure is by no means limited these preferred Examples. The structures, the configurations, the manufacturing conditions, the manufacturing methods, and the used materials of the image pickup element, the photoelectric conversion elements, the laminated image pickup element, and the solid-state image pickup device which have been described in Examples are exemplifications, and thus can be suitably changed. When the photoelectric conversion element of the present disclosure is made to function as the solar cell, it is only necessary to irradiate the organic photoelectric conversion layer with the light in a state in which no voltage is applied across the first electrode and the second electrode.

The molecular structure is no object as long as the first organic semiconductor material has the high hole transport ability (for example, the hole mobility is $1 \times 10^{-4}$ cm$^2$/V·s or more, preferably $1 \times 10^{-3}$ cm$^2$/V·s or more, and more preferably $1 \times 10^{-2}$ cm$^2$/V·s or more). For example, the first organic semiconductor material can be constituted by the material having the benzothiophene structure as the partial skeleton of the structural formula (1) or the structural formula (2), or the structural formula (101) to the structural formula (116). Here, benzothiophene is one of the partial structures of acenedichalcogenophene, and thus has the high hole transfer ability. Alternatively, the first organic semiconductor material can be constituted by the acenedichalcogenophene system organic material.

It should be noted that the present disclosure can also adopt the following constitutions.

[A01]<<Image Pickup Element: First Aspect>>

An image pickup element constituted by laminating at least a first electrode, an organic photoelectric conversion layer, and a second electrode in order, the organic photoelectric conversion layer including a first organic semiconductor material having the following structural formula (1):

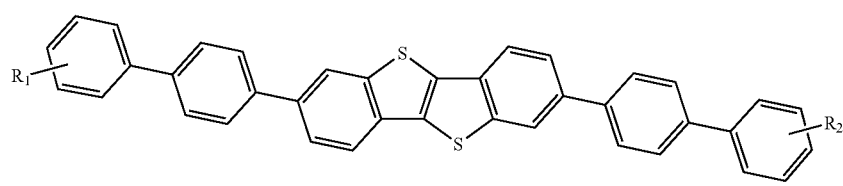

(1)

where $R_1$ and $R_2$ are each groups independently selected from hydrogen, an aromatic hydrocarbon group, a heterocyclic group, a halogenated aromatic group, or a fused heterocyclic group, and have an optional substituent;

the aromatic hydrocarbon group is an aromatic hydrocarbon group selected from the group consisting of a phenyl group, a naphthyl group, an anthryl group, a phenanthryl group, a pyrenyl group, and a benzopyrenyl group;

the heterocyclic group is a heterocyclic group selected from the group consisting of a pyridyl group, a pyradyl group, a pyrimidyl group, a quinolyl group, an isoquinolyl group, a pyrrolyl group, an indolenyl group, an imidazolyl group, a thienyl group, a furyl group, a pyranyl group, and a pyridonyl group;

the halogenated aromatic group is a halogenated aromatic group selected from the group consisting of a phenyl group, a naphthyl group, an anthryl group, a phenanthryl group, a pyrenyl group, and a benzopyrenyl group; and the fused heterocyclic group is a fused heterocyclic group selected from the group consisting of a benzoquinolyl group, an anthraquinolyl group, and a benzothienyl group.

[A02]<<Image Pickup Element: Second Aspect>>

An image pickup element constituted by laminating at least a first electrode, an organic photoelectric conversion layer, and a second electrode in order, the organic photoelectric conversion layer including a first organic semiconductor material having the following structural formula (2):

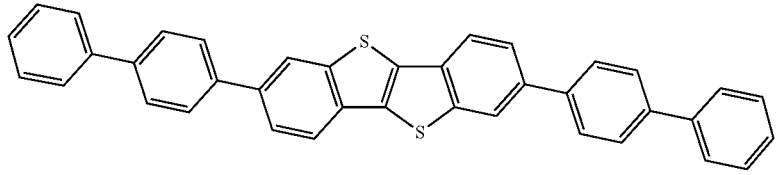

(2)

[A03]

The image pickup element described in [A01] or [A02], in which the organic photoelectric conversion layer further includes a second organic semiconductor material, the second organic semiconductor material includes either fullerene or a fullerene derivative.

[A04]

The image pickup element described in [A01] or [A02], in which the organic photoelectric conversion layer further includes a second organic semiconductor material and a third organic semiconductor material;

the second organic semiconductor material includes either fullerene or a fullerene derivative; and a value $\mu_3$ of a line absorption coefficient in a local maximum optical absorption wavelength of a visible light region of the third organic semiconductor material is larger than a value $\mu_1$ of a line absorption coefficient in a local maximum optical absorption wavelength of a visible light region of the first organic semiconductor material, and is larger than a value $\mu_2$ of a line absorption coefficient in a local maximum optical absorption wavelength of a visible light region of the second organic semiconductor material.

[A05]

The image pickup element described in [A04], in which an exciton generated by optical absorption of the third organic semiconductor material is subjected to exciton separation in both interfaces of the organic semiconductor materials selected from two of the first organic semiconductor material, the second organic semiconductor material, and the third organic semiconductor material, or an exciton generated by optical absorption of the third organic semiconductor material is subjected to exciton separation in an interface of one kind of organic semiconductor material selected from the first organic semiconductor material, the second organic semiconductor material, and the third organic semiconductor material.

[A06]

The image pickup element described in [A05], in which an exciton charge separation rate at which the exciton is subjected to the exciton separation is $1\times10^{10}$ s$^{-1}$ or more.

[A07]

The image pickup element described in any one of [A04] to [A06], in which the organic photoelectric conversion layer has a local maximum optical absorption wavelength in the range of 450 nm or more to 650 nm or less.

[A08]

The image pickup element described in any one of [A04] to [A07], in which the third organic semiconductor material includes a sub-phthalocyanine system derivative.

[A09]

The image pickup element described in any one of [A04] to [A08], in which the organic photoelectric conversion layer further includes a fourth organic semiconductor material; and the fourth organic semiconductor material includes a mother skeleton similar to that of the first organic semiconductor material, or has the same mother skeleton as that of either the second organic semiconductor material or the third organic semiconductor material, and includes a different substituent.

[A10]

The image pickup element described in [A01] or [A02], in which the organic photoelectric conversion layer further includes a second organic semiconductor material and a third organic semiconductor material; and an area in a portion in which an energy distribution state density of highest occupied molecular orbital or lowest unoccupied molecular orbital of the second organic semiconductor material, and the an energy distribution state density of HOMO or LUMO of the third organic semiconductor material overlap each other is 0.15 meV or more.

[A11]

The image pickup element described in [A10], in which an energy distribution σ of the third organic semiconductor material or an energy distribution σ of the second organic semiconductor material is 70 meV or less.

[A12]

The image pickup element described in [A10] or [A11], in which the second organic semiconductor material includes either fullerene or a fullerene derivative.

[A13]

The image pickup element described in any one of [A10] to [A12], in which the third organic semiconductor material includes a sub-phthalocyanine system derivative.

[A14]

The image pickup element described in any one of [A01] to [A13], in which hole mobility of the first organic semiconductor material is $1\times10^-$ cm$^2$/V·s or more.

[A15]

The image pickup element described in any one of [A01] to [A14], in which the first electrode and the second electrode include a transparent conductive material.

[A16]

The image pickup element described in any one of [A01] to [A14], in which one of the first electrode and the second electrode includes a transparent conductive material, and the other includes a metallic material.

[A17]

The image pickup element described in any one of [A01] to [A16], in which a wavelength of an optical absorption peak in an optical absorption spectrum of the organic photoelectric conversion layer falls within a visible light region.

[A18]

The image pickup element described in any one of [A01] to [A17], in which an optical absorption spectrum of the organic photoelectric conversion layer has one local maximum value in the visible light region.

[A19]

The image pickup element described in any one of [A01] to [A18], in which an absorption coefficient of the organic photoelectric conversion layer is $1 \times 10^5$ or more.

[A20]

The image pickup element described in any one of [A01] to [A19], in which a sublimation temperature under an atmosphere of a material constituting the organic photoelectric conversion layer is 250° C. or more.

[B01]<<Laminated Image Pickup Element>>

A laminated image pickup element constituted by laminating at least two image pickup elements described in any one of [A01] to [A20].

[C01]<<Solid-State Image Pickup Device: First Aspect>>

A solid-state image pickup device comprising a plurality of image pickup elements described in any one of [A01] to [A20].

[C02]<<Solid-State Image Pickup Device: Second Aspect>>

A solid-state image pickup device comprising a plurality of laminated image pickup elements described in [B01].

[D01]<<Photoelectric Conversion Element: First Aspect>>

A photoelectric conversion element constituted by laminating at least a first electrode, an organic photoelectric conversion layer, and a second electrode in order, the organic photoelectric conversion layer including a first organic semiconductor material having the following structural formula (1):

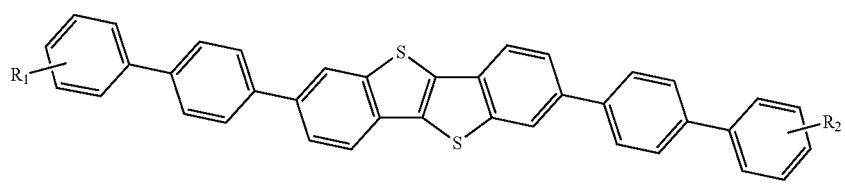

(1)

where $R_1$ and $R_2$ are each groups independently selected from hydrogen, an aromatic hydrocarbon group, a heterocyclic group, a halogenated aromatic group, or a fused heterocyclic group, and have an optional substituent;

the aromatic hydrocarbon group is an aromatic hydrocarbon group selected from the group consisting of a phenyl group, a naphthyl group, an anthryl group, a phenanthryl group, a pyrenyl group, and a benzopyrenyl group;

the heterocyclic group is a heterocyclic group selected from the group consisting of a pyridyl group, a pyradyl group, a pyrimidyl group, a quinolyl group, an isoquinolyl group, a pyrrolyl group, an indolenyl group, an imidazolyl group; a thienyl group, a furyl group, a pyranyl group, and a pyridonyl group;

the halogenated aromatic group is a halogenated aromatic group selected from the group consisting of a phenyl group, a naphthyl group, an anthryl group, a phenanthryl group, a pyrenyl group, and a benzopyrenyl group; and the fused heterocyclic group is a fused heterocyclic group selected from the group consisting of a benzoquinolyl group, an anthraquinolyl group, and a benzothienyl group.

[D02]<<Photoelectric Conversion Element: Second Aspect>>

A photoelectric conversion element constituted by laminating at least a first electrode, an organic photoelectric conversion layer, and a second electrode in order, the organic photoelectric conversion layer including a first organic semiconductor material having the following structural formula (2):

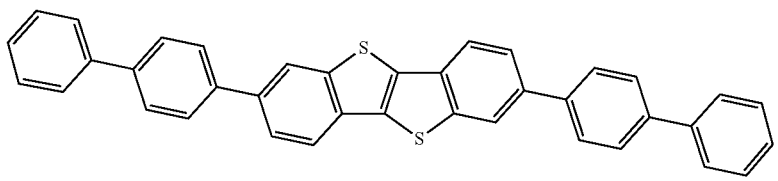

(2)

[D03]

The photoelectric conversion element described in [D01] or [D02], in which the organic photoelectric conversion layer further includes a second organic semiconductor material; and the second organic semiconductor material includes either fullerene or a fullerene derivative.

[D04]

The photoelectric conversion element described in [D01] or [D02], in which the organic photoelectric conversion layer further includes a second organic semiconductor material and a third organic semiconductor material;

the second organic semiconductor material is constituted by either fullerene or a fullerene derivative; and a value $\mu_3$ of a line absorption coefficient in a local maximum optical absorption wavelength of a visible light region of the third organic semiconductor material is larger than a value $\mu_1$ of a line absorption coefficient in a local maximum optical absorption wavelength of a visible light region of the first organic semiconductor material, and is larger than a value $\mu_2$ of a line absorption coefficient in a local maximum optical absorption wavelength of a visible light region of the second organic semiconductor material.

[D05]

The photoelectric conversion element described in [D04], in which an exciton generated by optical absorption of the third organic semiconductor material is subjected to exciton separation in both interfaces of the organic semiconductor materials selected from two of the first organic semiconductor material, the second organic semiconductor material, and the third organic semiconductor material, or an exciton generated by optical absorption of the third organic semiconductor material is subjected to exciton separation in an interface of one kind of organic semiconductor material selected from the first organic semiconductor material, the second organic semiconductor material, and the third organic semiconductor material.

[D06]

The photoelectric conversion element described in [D05], in which an exciton charge separation rate at which the exciton is subjected to the exciton separation is $1 \times 10^{10}$ s$^{-1}$ or more.

[D07]

The photoelectric conversion element described in any one of [D04] to [D06], in which the organic photoelectric conversion layer has a local maximum optical absorption wavelength in the range of 450 nm or more and 650 nm or less.

[D08]

The photoelectric conversion element described in any one of [D04] to [D07], in which the third organic semiconductor material includes a sub-phthalocyanine system derivative.

[D09]

The photoelectric conversion element described in any one of [D04] to [D08], in which the organic photoelectric conversion layer further includes a fourth organic semiconductor material; and the fourth organic semiconductor material includes a mother skeleton similar to that of the first organic semiconductor material, or has the same mother skeleton as that of either the second organic semiconductor material or the third organic semiconductor material, and includes a different substituent.

[D10]

The photoelectric conversion element described in [D01] or [D02], in which the organic photoelectric conversion layer further includes a second organic semiconductor material and a third organic semiconductor material; and an area in a portion in which an energy distribution state density of highest occupied molecular orbital or lowest unoccupied molecular orbital of the second organic semiconductor material, and the an energy distribution state density of highest occupied molecular orbital or lowest unoccupied molecular orbital of the third organic semiconductor material overlap each other is 0.15 meV or more.

[D11]

The photoelectric conversion element described in [D10], in which an energy distribution σ of the third organic semiconductor material or an energy distribution σ of the second organic semiconductor material is 70 meV or less.

[D12]

The photoelectric conversion element described in [D10] or [D11], in which the second organic semiconductor material includes either fullerene or a fullerene derivative.

[D13]

The photoelectric conversion element described in any one of [D10] to [D12], in which the third organic semiconductor material includes a sub-phthalocyanine system derivative.

[D14]

The photoelectric conversion element described in any one of [D01] to [D13], in which hole mobility of the first organic semiconductor material is $1 \times 10^{-5}$ cm$^2$/V·s or more.

[D15]

The photoelectric conversion element described in any one of [D01] to [D14], in which the first electrode and the second electrode include a transparent conductive material.

[D16]

The photoelectric conversion element described in any one of [D01] to [D14], in which one of the first electrode and the second electrode includes a transparent conductive material, and the other includes a metallic material.

[D17]

The photoelectric conversion element described in any one of [D01] to [D16], in which a wavelength of an optical absorption peak in an optical absorption spectrum of the organic photoelectric conversion layer falls within a visible light region.

[D18]

The photoelectric conversion element described in any one of [D01] to [D17], in which an optical absorption spectrum of the organic photoelectric conversion layer has one local maximum value in the visible light region.

[D19]

The photoelectric conversion element described in any one of [D01] to [D18], in which an absorption coefficient of the organic photoelectric conversion layer is $1 \times 10^5$ or more.

[D20]

The photoelectric conversion element described in any one of [D01] to [D19], in which a sublimation temperature under an atmosphere of a material constituting the organic photoelectric conversion layer is 250° C. or more.

REFERENCE SIGNS LIST

11 . . . Image pickup element (photoelectric conversion element), 20 . . . Substrate, 21 . . . First electrode, 22 . . . Second electrode, 30 . . . Organic photoelectric conversion layer, 31 . . . Convex portion, 40 . . . Solid-state image pickup device, 41 . . . Image pickup area, 42 . . . Vertical drive circuit, 43 . . . Column signal processing circuit, 44 . . . Horizontal drive circuit, 45 . . . Output circuit, 46 . . . Control circuit, 47 . . . Vertical signal line, 48 . . . Horizontal signal line

The invention claimed is:

1. An image pickup element constituted by laminating at least a first electrode, an organic photoelectric conversion layer, and a second electrode in order, the organic photoelectric conversion layer including a first organic semiconductor material having the following structural formula (1):

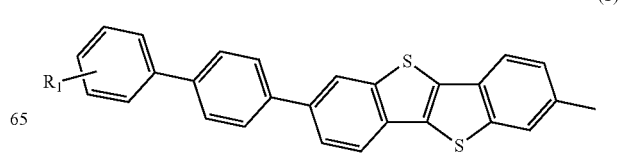

(1)

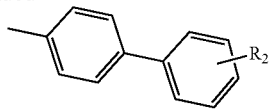

where $R_1$ and $R_2$ are each groups independently selected from hydrogen, an aromatic hydrocarbon group, a heterocyclic group, a halogenated aromatic group, or a fused heterocyclic group, and having an optional substituent;

the aromatic hydrocarbon group is selected from the group consisting of a phenyl group, a naphthyl group, an anthryl group, a phenanthryl group, a pyrenyl group, and a benzopyrenyl group;

the heterocyclic group is selected from the group consisting of a pyridyl group, a pyradyl group, a pyrimidyl group, a quinolyl group, an isoquinolyl group, a pyrrolyl group, an indolenyl group, an imidazolyl group; a thienyl group, a furyl group, a pyranyl group, and a pyridonyl group;

the halogenated aromatic group comprises an aromatic group selected from the group consisting of a phenyl group, a naphthyl group, an anthryl group, a phenanthryl group, a pyrenyl group, and a benzopyrenyl group;

the fused heterocyclic group is selected from the group consisting of a benzoquinolyl group, an anthraquinolyl group, and a benzothienyl group;

wherein the organic photoelectric conversion layer further includes a second organic semiconductor material and a third organic semiconductor material;

the second organic semiconductor material includes either fullerene or a fullerene derivative; and a value $\mu_3$ of a line absorption coefficient in a local maximum optical absorption wavelength of a visible light region of the third organic semiconductor material is larger than a value $\mu_1$ of a line absorption coefficient in a local maximum optical absorption wavelength of a visible light region of the first organic semiconductor material, and is larger than a value $\mu_2$ of a line absorption coefficient in a local maximum optical absorption wavelength of a visible light region of the second organic semiconductor material.

2. The image pickup element according to claim 1, wherein an exciton generated by optical absorption of the third organic semiconductor material is subjected to exciton separation in both interfaces of the organic semiconductor materials selected from two of the first organic semiconductor material, the second organic semiconductor material, and the third organic semiconductor material, or an exciton generated by optical absorption of the third organic semiconductor material is subjected to exciton separation in an interface of one kind of organic semiconductor material selected from the first organic semiconductor material, the second organic semiconductor material, and the third organic semiconductor material.

3. The image pickup element according to claim 2, wherein an exciton charge separation rate at which the exciton is subjected to the exciton separation is $1 \times 10^{10}$ s$^{-1}$ or more.

4. The image pickup element according to claim 1, wherein the organic photoelectric conversion layer has a local maximum optical absorption wavelength in the range of 450 nm to 650 nm.

5. The image pickup element according to claim 1, wherein the third organic semiconductor material includes a sub-phthalocyanine system derivative.

6. The image pickup element according to claim 1, wherein the organic photoelectric conversion layer further includes a fourth organic semiconductor material; and the fourth organic semiconductor material includes a mother skeleton similar to that of the first organic semiconductor material, or has the same mother skeleton as that of either the second organic semiconductor material or the third organic semiconductor material, and includes a different substituent.

7. The image pickup element according to claim 1, wherein an area in a portion in which an energy distribution state density of highest occupied molecular orbital or lowest unoccupied molecular orbital of the second organic semiconductor material, and an energy distribution state density of highest occupied molecular orbital or lowest unoccupied molecular orbital of the third organic semiconductor material overlap each other is 15 meV or more.

8. The image pickup element according to claim 7, wherein an energy distribution of the third organic semiconductor material or an energy distribution of the second organic semiconductor material is 70 meV or less.

9. The image pickup element according to claim 1, wherein a hole mobility of the first organic semiconductor material is $1 \times 10^{-5}$ cm$^2$/V·s or more.

10. The image pickup element according to claim 1, wherein the first electrode and the second electrode include a transparent conductive material.

11. The image pickup element according to claim 1, wherein one of the first electrode and the second electrode includes a transparent conductive material, and the other includes a metallic material.

12. A laminated image pickup element constituted by laminating at least two image pickup elements according to claim 1.

13. A solid-state image pickup device comprising a plurality of laminated image pickup elements according to claim 12.

14. A solid-state image pickup device comprising a plurality of image pickup elements according to claim 1.

15. The image pickup element according to claim 1, wherein the second organic semiconductor material includes fullerene.

16. An image pickup element constituted by laminating at least a first electrode, an organic photoelectric conversion layer, and a second electrode in order, the organic photoelectric conversion layer including a first organic semiconductor material having the following structural formula (2):

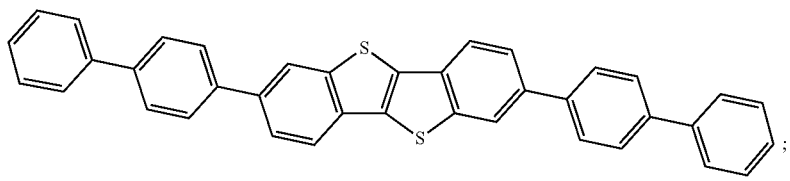

(2)

wherein the organic photoelectric conversion layer further includes a second organic semiconductor material and a third organic semiconductor material;

the second organic semiconductor material includes either fullerene or a fullerene derivative; and a value $\mu_3$ of a line absorption coefficient in a local maximum optical absorption wavelength of a visible light region of the third organic semiconductor material is larger than a value $\mu_1$ of a line absorption coefficient in a local maximum optical absorption wavelength of a visible light region of the first organic semiconductor material, and is larger than a value $\mu_2$ of a line absorption coefficient in a local maximum optical absorption wavelength of a visible light region of the second organic semiconductor material.

17. The image pickup element according to claim 16, wherein the second organic semiconductor material includes fullerene.

18. A photoelectric conversion element constituted by laminating at least a first electrode, an organic photoelectric conversion layer, and a second electrode in order, the organic photoelectric conversion layer including a first organic semiconductor material having the following structural formula (1):

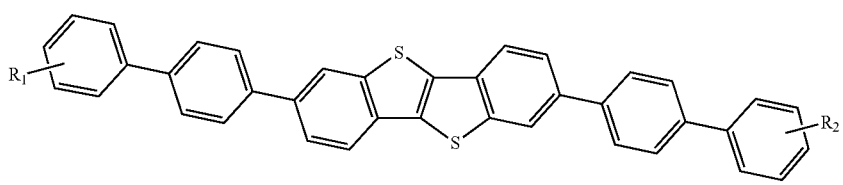

(1)

where $R_1$ and $R_2$ are each groups independently selected from hydrogen, an aromatic hydrocarbon group, a heterocyclic group, a halogenated aromatic group, or a fused heterocyclic group, and have an optional substituent;

the aromatic hydrocarbon group is selected from the group consisting of a phenyl group, a naphthyl group, an anthryl group, a phenanthryl group, a pyrenyl group, and a benzopyrenyl group;

the heterocyclic group is selected from the group consisting of a pyridyl group, a pyradyl group, a pyrimidyl group, a quinolyl group, an isoquinolyl group, a pyrrolyl group, an indolenyl group, an imidazolyl group, a thienyl group, a furyl group, a pyranyl group, and a pyridonyl group;

the halogenated aromatic group comprises an aromatic group selected from the group consisting of a phenyl group, a naphthyl group, an anthryl group, a phenanthryl group, a pyrenyl group, and a benzopyrenyl group; and the fused heterocyclic group is selected from the group consisting of a benzoquinolyl group, an anthraquinolyl group, and a benzothienyl group, wherein the organic photoelectric conversion layer further includes a second organic semiconductor material and a third organic semiconductor material;

the second organic semiconductor material is constituted by either fullerene or a fullerene derivative; and a value $\mu_3$ of a line absorption coefficient in a local maximum optical absorption wavelength of a visible light region of the third organic semiconductor material is larger than a value $\mu_1$ of a line absorption coefficient in a local maximum optical absorption wavelength of a visible light region of the first organic semiconductor material, and is larger than a value $\mu_2$ of a line absorption coefficient in a local maximum optical absorption wavelength of a visible light region of the second organic semiconductor material.

19. The photoelectric conversion element according to claim 18, wherein the second organic semiconductor material is constituted by fullerene.

20. A photoelectric conversion element constituted by laminating at least a first electrode, an organic photoelectric conversion layer, and a second electrode, in order, the organic photoelectric conversion layer including a first organic semiconductor material having the following structural formula (2):

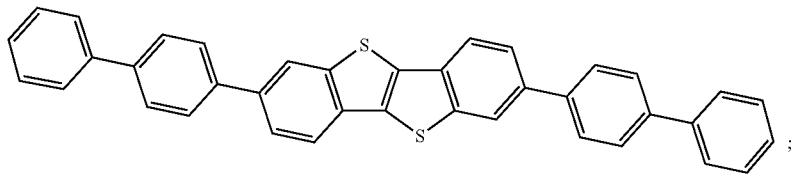

(2)

wherein the organic photoelectric conversion layer further includes a second organic semiconductor material and a third organic semiconductor material;
the second organic semiconductor material is constituted by either fullerene or a fullerene derivative; and
a value $\mu_3$ of a line absorption coefficient in a local maximum optical absorption wavelength of a visible light region of the third organic semiconductor material is larger than a value $\mu_1$ of a line absorption coefficient in a local maximum optical absorption wavelength of a visible light region of the first organic semiconductor material, and is larger than a value $\mu_2$ of a line absorption coefficient in a local maximum optical absorption wavelength of a visible light region of the second organic semiconductor material.

21. The photoelectric conversion element according to claim 20, wherein the second organic semiconductor material is constituted by fullerene.

\* \* \* \* \*